US00RE49603E

(19) United States
(12) Reissued Patent
Macelwee et al.

(10) Patent Number: US RE49,603 E
(45) **Date of Reissued Patent: *Aug. 8, 2023**

(54) GAN-ON-SI SEMICONDUCTOR DEVICE STRUCTURES FOR HIGH CURRENT/ HIGH VOLTAGE LATERAL GAN TRANSISTORS AND METHODS OF FABRICATION THEREOF

(71) Applicant: GaN Systems Inc., Ottawa (CA)

(72) Inventors: Thomas Macelwee, Nepean (CA); Greg P. Klowak, Ottawa (CA); Howard Tweddle, Carp (CA)

(73) Assignee: GAN SYSTEMS INC., Ottawa (CA)

( * ) Notice: This patent is subject to a terminal disclaimer.

(21) Appl. No.: 16/868,632

(22) Filed: May 7, 2020

Related U.S. Patent Documents

Reissue of:
(64) Patent No.: 10,283,501
Issued: May 7, 2019
Appl. No.: 15/447,200
Filed: Mar. 2, 2017

U.S. Applications:
(60) Provisional application No. 62/302,850, filed on Mar. 3, 2016.

(51) Int. Cl.
*H01L 21/304* (2006.01)
*H01L 27/088* (2006.01)
(Continued)

(52) U.S. Cl.
CPC ..... *H01L 27/088* (2013.01); *H01L 21/3043* (2013.01); *H01L 21/0254* (2013.01);
(Continued)

(58) Field of Classification Search
CPC . H01L 27/0088; H01L 21/3043; H01L 21/78; H01L 21/782; H01L 21/784;
(Continued)

(56) References Cited

U.S. PATENT DOCUMENTS 5,585,648 A 12/1996 Tischler
5,661,074 A 8/1997 Tischler
(Continued)

OTHER PUBLICATIONS

Hamamatsu webpage, "Stealth Dicing vs. Ordinary Dicing Methods", Jan. 11, 2016 (https://jp.hamamatsu.com/sd/SD_MENU_Comparison_eg.html); 2 pages.
(Continued)

*Primary Examiner* — Tuan H Nguyen
*Assistant Examiner* — Timothy M Speer
(74) *Attorney, Agent, or Firm* — Workman Nydegger

(57) ABSTRACT

A GaN-on-Si device structure and a method of fabrication are disclosed for improved die yield and device reliability of high current/high voltage lateral GaN transistors. A plurality of conventional GaN device structures comprising GaN epi-layers are fabricated on a silicon substrate (GaN-on-Si die). After processing of on-chip interconnect layers, a trench structure is defined around each die, through the GaN epi-layers and into the silicon substrate. A trench cladding is provided on proximal sidewalls, comprising at least one of a passivation layer and a conductive metal layer. The trench cladding extends over exposed surfaces of the GaN epi-layers, over the interface region with the substrate, and also over the exposed surfaces of the interconnect layers. This structure reduces risk of propagation of dicing damage and defects or cracks in the GaN epi-layers into active device regions. A metal trench cladding acts as a barrier for electro-migration of mobile ions.

30 Claims, 15 Drawing Sheets

(51) Int. Cl.

| | |
|---|---|
| ***H01L 29/20*** | (2006.01) |
| ***H01L 23/528*** | (2006.01) |
| ***H01L 23/31*** | (2006.01) |
| ***H01L 23/58*** | (2006.01) |
| ***H01L 21/02*** | (2006.01) |
| *H01L 29/778* | (2006.01) |
| *H01L 21/78* | (2006.01) |

(52) U.S. Cl.
CPC ..... *H01L 21/02381* (2013.01); *H01L 21/78* (2013.01); *H01L 23/3171* (2013.01); *H01L 23/528* (2013.01); *H01L 23/585* (2013.01); *H01L 29/2003* (2013.01); *H01L 29/778* (2013.01)

(58) Field of Classification Search
CPC . H01L 29/205; H01L 29/778; H01L 29/7782; H01L 29/2003; H01L 21/0254; H01L 21/02381; H01L 29/7786; H01L 29/7787; H01L 29/66431; H01L 29/66446
See application file for complete search history.

(56) References Cited

U.S. PATENT DOCUMENTS

| | | | | |
|---|---|---|---|---|
| 5,874,747 | A | 2/1999 | Redwing et al. | |
| 6,992,026 | B2 | 1/2006 | Fukuyo et al. | |
| 8,354,734 | B2 | 1/2013 | Wang et al. | H01L 23/585 257/620 |
| 8,652,939 | B2 | 2/2014 | Sung et al. | |
| 8,987,923 | B2 | 3/2015 | Chou et al. | |
| 9,105,706 | B2 | 8/2015 | Otsuka | |
| 9,153,809 | B2 | 10/2015 | Klowak et al. | |
| 9,768,125 | B2 * | 9/2017 | Hiyoshi | H01L 23/562 |
| 10,249,506 | B2 * | 4/2019 | Macelwee | H01L 23/585 |
| 2009/0166678 | A1 * | 7/2009 | Sato | H01L 29/0657 438/517 |
| 2009/0278236 | A1 * | 11/2009 | Sato | H01L 21/6836 257/620 |
| 2012/0292642 | A1 | 11/2012 | Urata et al. | |
| 2015/0060942 | A1 * | 3/2015 | Kume | H01L 29/66462 257/190 |
| 2015/0115448 | A1 * | 4/2015 | Maier | H01L 23/3185 257/751 |
| 2015/0123264 | A1 | 5/2015 | Napetschnig et al. | |
| 2015/0311162 | A1 | 10/2015 | Chen | |
| 2016/0204074 | A1 * | 7/2016 | Lin | H01L 21/784 257/76 |

OTHER PUBLICATIONS

Gonzalez, Mario et al.; "GaN Growth on Patterned Silicon Substrates. A thermo mechanical study on wafer bow reduction"; 13th International Conference on Thermal, Mechanical and Multi-Physics Simulation and Experiments in Microelectronics and Microsystems, EuroSimE; 2012; pp. 1-6.

J. Moussodji et al., "Laser grooving of multi stack material modeling: implementation of a high accuracy tool for laser-grooving and dicing application", Proc. SPIE 10905, Laser Application in Microelectronic and Optoelectronic Manufacturing (LAMON) XXIV, 109050D (Mar. 4, 2019); doi: 10.1117/12.2504649.

Hamamatsu webpage "Stealth Dicing Technology", Jan. 11, 2016 (http://www.hamamatsu.com/eu/technology/innovation/sd/index.html; as of Feb. 20, 2017 redirected to http://www.hamamatsu.com/us/en/technology/innovation/sd/index.html); pp. 1-2 of 7.

* cited by examiner

GAN-ON-SI SEMICONDUCTOR DEVICE STRUCTURES FOR HIGH CURRENT/ HIGH VOLTAGE LATERAL GAN TRANSISTORS AND METHODS OF FABRICATION THEREOF

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED [APPLICATION] *APPLICATIONS*

The present application *is a reissue application of U.S. patent application Ser. No. 15/447,200 filed Mar. 2, 2017, now U.S. Pat. No. 10,283,501, which* claims the benefit of U.S. provisional application No. 62/302,850 filed Mar. 3, 2016.

TECHNICAL FIELD

The present invention relates to fabrication of devices and systems comprising high current/high voltage nitride semiconductor devices, and particularly to lateral Gallium Nitride (GaN) power transistors, for improved reliability.

BACKGROUND

GaN devices are expected to be widely adopted for power switches as production costs are reduced, for example, by fabrication of lateral GaN transistors on lower cost silicon substrates (GaN-on-Si die). Lateral GaN power transistors offer low on-resistance $R_{on}$ and high current capability per unit active area of the device.

For example, lateral GaN High Electron Mobility Transistors (HEMTs) comprise a GaN heterolayer structure comprising a layer of GaN and an overlying layer of Aluminum Gallium Nitride (AlGaN). The GaN/AlGaN heterostructure provides a two-dimensional Electron Gas (2DEG) active layer. The GaN semiconductor layers are epitaxially grown on the underlying native silicon substrate ("growth substrate"). Since there is a lattice mismatch between the GaN semiconductor layers and the silicon surface, the stack of epitaxial layers (epi-layer stack) typically comprises one or more intermediate layers, which may be referred to as transition layers or buffer layers, underlying the GaN/AlGaN heterostructure layers.

Silicon growth substrates offer lower cost fabrication relative to conventional growth substrates for GaN devices, such as, silicon carbide or sapphire. In particular, silicon substrates are available as large diameter, low cost wafers. It is desirable to increase wafer scale processing for GaN-on-Silicon structures to enable use of at least 8 inch or 12 inch silicon wafers.

However, the lattice mismatch between the GaN semiconductor layers and the silicon surface tends to cause significant interlayer stresses/strains and wafer bowing when using large scale wafers. A thinner epi-layer stack thickness, e.g. ~2 μm, helps to reduce stresses and wafer bowing that is caused by the GaN/Si lattice mismatch, so that use of larger diameter wafers for larger scale fabrication becomes feasible. However, for high voltage and high current devices, the use of a thicker GaN epi-layer stack, e.g. ~6 μm, may be preferred to provide increased breakdown voltage.

The lattice mismatch and the resulting interlayer stresses/strains between the GaN epi-layers and the silicon substrate introduces defects, such as misfit dislocations, which can potentially lead to cracking during fabrication and subsequent defect related reliability issues.

One significant issue is cracking or propagation of defects in the GaN epi-layers during wafer dicing to separate individual die. For example, it has been observed that wafer dicing using conventional mechanical sawing, i.e. blade dicing with a diamond saw, can cause dicing damage that seeds cracks in the GaN epi-layers. If these cracks are not detected in final test, the cracks can subsequently propagate into active areas of the device and cause reliability issues. Laser ablation or laser grooving is another well-established approach to die singulation, which avoids the mechanical damage and debris caused by wafer sawing with a blade. Laser grooving may be used instead of wafer sawing, or in combination with conventional wafer sawing. However, it has been observed that laser grooving also creates surface damage and/or defects in the region of the substrate/GaN epi-layer interface. A subsequent etching or surface cleaning step may be required to mitigate this damage.

Other methods for wafer dicing include plasma dicing, Stealth Dicing (SD) and other methods using laser induced cleaving or splitting. Plasma dicing uses reactive ion etching or other form of dry etching, to cut a trench and remove material from the dicing street. Stealth dicing uses high power laser pulses, which create microscopic sub-surface damage to initiate controlled cleaving or splitting of the substrate wafer along the laser defined scribe line.

"Stealth Dicing" is disclosed for example in U.S. Pat. No. 6,992,026; https://jp.hamamatsu.com/sd/SD_MENU_Comparison_eg_html; and http://www.hamamatsu.com/eu/en/technology/innovation/sd/index.html. For some substrate materials, the latter approach has been reported to reduce damage and debris and eliminate the need for a cleaning or etching to remove dicing debris or laser damage after dicing, e.g. when cutting substrate materials such as silicon and glass. United States patent publication No. US 2015/0123264 to Napetschnig et al. (Infineon), discusses limitations of plasma dicing and discloses that modern wafer dicing methods, such as plasma dicing offer advantages for some materials, but may not be suitable for cutting through other materials, e.g. thick metal layers such as back-side contact metallization layers. United States patent publication No. US2012/0292642 to Urata et al. entitled "Functional Element and Manufacturing Method of the Same" makes reference to several prior art patent documents disclosing methods for cleaving or splitting semiconductor substrates. For example, this reference discloses a method of splitting a wafer comprising a GaN HEMT on a silicon carbide substrate using a property altering laser light, i.e. having short pulses picosecond or femtosecond pulsed laser, to form subsurface regions that are easier to split and/or to laser cut V-grooves as scribe lines to facilitate controlled splitting or cleaving of a sapphire or silicon carbide wafer. However, for GaN-on-Si die, stealth dicing or other methods for inducing cleaving of the GaN epi-layers would lead to cracking and damage of the GaN-epilayers.

Thus, it is apparent that there is a range of known methods available for die singulation including conventional mechanical cutting or sawing, laser ablation or laser grooving, plasma dicing or dry etching of grooves or trenches, and or more recently introduced laser induced cleaving/splitting techniques. However, none of the above mentioned references address issues of cracking or delamination of the GaN epi-layers during wafer dicing for singulation of large area GaN-on-Si die comprising high voltage/high current GaN power transistors.

In contrast, the issue of crack formation and propagation in dielectric layers at corners or edges of a die during wafer dicing is well recognized. For example, issues of poor yield and reliability caused by poor mechanical properties of low k dielectrics which can lead to dicing induced damage and may cause cracking of dielectric layers and delamination of metal and dielectric layers is discussed, for example, in United States Patent Application publication No. US 2015/0311162 A1, to Chen (TSMC) entitled "Dicing Structures for Semiconductor Substrates and Methods of Fabrication Thereof"; U.S. Pat. No. 8,354,734 B2 to Wang (TSMC) entitled "Semiconductor Device with Crack Prevention Ring"; U.S. Pat. No. 9,105,706 B2 to Otsuka (Fujitsu), entitled "Semiconductor Device Fabrication Method Capable Of Scribing Chips With High Yield"; and U.S. Pat. No. 8,652,939B2 to Sung (TSMC) entitled "Method and Apparatus for Die Assembly". Thus, as disclosed in these references, various protective structures such as grooves, sealing rings or other structures, may be provided around edges of the die to protect edges of the dielectric and metallization layers during dicing, and prevent cracking of dielectric layers. However, such structures do not address issues with dicing induced cracking or defect creation in the active regions comprising GaN epi-layers on a silicon substrate, where lattice mismatch creates significant interlayer stresses/strains and misfit dislocations in the GaN epi-layers.

In the field of GaN optoelectronic devices, it is known to pattern the silicon substrate to provide mesa structures, and then form the GaN devices on the mesas. The active regions are thereby raised above the silicon surface and spaced from the scribe lines, so that dicing damage is kept away from the active device regions, e.g. see U.S. Pat. No. 5,874,747 B2 to Redwing et al., entitled "High Brightness Electroluminescent Device Emitting In The Green To Ultraviolet Spectrum And Method Of Making The Same". Thus, a combination of processing and etching to form devices on mesas with trenches in between, followed by conventional wafer sawing. This reference teaches that growth on reduced area mesas, e.g. 50 μm vs. 200 μm can reduce defect densities. Due to the small area of the mesas, e.g. 170 μm diameter used for LEDs, misfit dislocations due to lattice mismatch can move or migrate to edges of the mesa and annihilate.

However, for large area, high voltage, high current lateral GaN power transistors, such as lateral GaN HEMTs, device sizes are significantly larger, i.e. in the order of millimeters square, e.g. a die size of 6 mm by 2 mm, or 10 mm×10 mm or more. The GaN epi-layer structure is typically several microns thick, e.g. 2 μm to 6 μm and extends over the entire wafer area. The active area of the transistor itself may be surrounded by an inactive region, which may include a protective structure such as a seal ring, as mentioned above. The individual die are typically separated by a dicing street of about 60 μm to 120 μm in width to provide for wafer sawing along a marker or scribe line spaced at least 40 μm from each die. Thus, for GaN power devices with these large die sizes, interlayer stresses/strains between the GaN epi-layers and the silicon substrate can lead to cracking, and dicing induced damage can significantly reduce yield of good die, as well as compromise long term device reliability.

An object of the present invention is to provide a device structure and a method of fabrication for GaN power devices, such as lateral GaN/AlGaN HEMTs, which addresses issues of interlayer stresses which lead to potential cracking and creation of defects in the GaN epi-layers during fabrication, and particularly during wafer dicing, for improved yield and reliability.

SUMMARY OF INVENTION

The present invention seeks to provide improved structures and methods of fabrication of nitride semiconductor devices, such as GaN power transistors and systems comprising one or more lateral GaN power transistors, which addresses at least one of the above mentioned problems, or at least provides an alternative.

Aspects of the invention provide a GaN-on-Si semiconductor device structure comprising a lateral GaN transistor, and a method of fabrication thereof.

One aspect of the invention provides a wafer scale nitride semiconductor device structure comprising:

a silicon substrate having formed thereon an GaN epi-layer stack for a plurality of GaN die (GaN-on-Si die), said plurality of GaN die being arranged as an array with dicing streets therebetween;

each GaN die comprising:

a part of the GaN epi-layer stack, the GaN epi-layer stack comprising a GaN/AlGaN hetero-layer structure defining a two dimensional electron gas (2DEG) active layer for the lateral GaN transistor;

a conductive metallization layer formed thereon defining source and drain electrodes of the lateral GaN transistor, and a gate electrode formed on a channel region between respective source and drain electrodes of the lateral GaN transistor; said source, drain and gate electrodes being provided on a front-side of the epi-layer stack over an active area of the die, an inactive area of the GaN epi-layer stack surrounding said active area of each die, and an overlying interconnect structure comprising metallization and dielectric layers formed thereon; and a (pre-dicing) trench structure formed around the periphery of each GaN die in said inactive area, the (pre-dicing) trench structure comprising a trench etched through any overlying dielectric layers of the interconnect structure, through the GaN epi-layer stack, and into a surface region of the silicon substrate to a depth below the interface region between the silicon substrate and the GaN epi-layer stack.

Another aspect of the invention provides a nitride semiconductor device comprising:

a GaN die comprising a silicon substrate and a GaN epi-layer stack formed thereon comprising a GaN/AlGaN hetero-layer structure defining a two dimensional electron gas (2DEG) active layer for a lateral GaN transistor;

a conductive metallization layer formed thereon defining source and drain electrodes of the lateral GaN transistor, and a gate electrode formed on a channel region between respective source and drain electrodes of the lateral GaN transistor; said source, drain and gate electrodes being provided on a front-side of the epi-layer stack over an active area of the die, an inactive area of the GaN epi-layer stack surrounding said active area of each die; and an overlying interconnect structure comprising metallization and dielectric layers formed thereon;

a trench structure formed around the periphery (all sides) of the GaN die extending through any layers of the overlying interconnect structure, through layers of the GaN epi-layer stack, and into a surface region of the silicon substrate to a depth below the interface between the silicon substrate and the epi-layer stack.

In a preferred embodiment, the trench structure is laterally spaced from the adjacent dicing streets, that is, the trench lies in the inactive region, between the dicing street and the active region of the epi-layer stack.

In another embodiment, the trench extends into the dicing street and is laterally spaced from a scribe line of the dicing street.

In another embodiment, the trench structure extends across the dicing street between adjacent die.

In some embodiments, the pre-dicing trench structure further comprising a trench cladding, the trench cladding comprising at least one passivation layer extending over the inner (proximal) sidewalls of the trench and sealing exposed surfaces of any overlying layers of the interconnect structure, layers of the GaN epi-layer stack and the interface region of the GaN epi-layers and the silicon substrate.

In some embodiments, the device structure further comprises at least one overlying passivation layer, the at least one overlying passivation layer extending conformally over surfaces of the die and extending into the trench to form a trench cladding, the trench cladding extending over the inner (proximal) sidewalls of the trench and sealing exposed surfaces of layers of the interconnect structure, layers of the GaN epi-layer stack and the interface region of the GaN epi-layers and the silicon substrate.

In some embodiments, the pre-dicing trench structure further comprises a trench cladding, the trench cladding comprising a metal layer and an overlying passivation layer, the trench cladding extending over the inner (proximal) sidewalls of the trench and sealing exposed surfaces of layers of the interconnect structure, layers of the GaN epi-layer stack and the interface region of the GaN epi-layers and the silicon substrate.

When the die further comprises a seal ring formed over the inactive region of the GaN epi-layer stack and surrounding the lateral GaN transistor, the trench structure is formed in the inactive region between the sealing ring and the dicing street.

In some embodiments, the metal layer of the trench lining is conductive and connects the silicon substrate to the source of the transistor. When the die further comprise a seal ring formed over the inactive region of the GaN epi-layer stack and surrounding the lateral GaN transistor, the trench structure being formed between the sealing ring and the dicing street, and wherein the conductive metal layer of the trench lining connects the silicon substrate to a metallization layer of the seal ring.

The trench structure serves to protect exposed edges of layers of the epi-layer stack, the interface region around the interface between the GaN epi-layers and the silicon substrate, and the basal planes of the GaN epi-layer stack, where delamination due to intrinsic stress can be a problem. The trench structure separates the active region of the GaN power transistor with its surrounding inactive region, from the dicing street, to protect edges of the epi-layers, including the interface region, from dicing damage.

The passivation layer of the pre-dicing trench structure comprises one or more layers of dielectric passivation, e.g. silicon dioxide, silicon nitride or other suitable dielectric material. Beneficially, the protective trench structure further comprises a layer of conductive metallization. The latter is preferably a metal layer that forms a diffusion barrier for electro-migration of contaminant ions, such as sodium or other mobile ions. Thus, firstly the protective trench structures serve to reduce risk of dicing induced damage to the interface region near the interface between the GaN epi-layers and the silicon substrate, and particularly to reduce the risk of cracking of the GaN epi-layers during or after dicing. Secondly, when the protective trench structure comprises a protective metal layer extending over the interface region near the interface between the GaN epi-layers and the silicon substrate, the metal layer serves to protect the interface region from mechanical damage, and also acts as a diffusion barrier to protect the active region of the GaN device from electro-migration of mobile ions or contaminants. The protective trench structure separates the cut edges of the die from the inactive region surrounding the active 2DEG region of the device, that is, the trench is located outside the active area of the die, in the inactive region adjacent to, or close to, the scribe street. This further reduces the risk that any dicing induced damage or defects will migrate through the GaN epi-layer stack as far as the active 2DEG region of the transistor.

Accordingly, another aspect of the invention provides a method of fabrication of a nitride semiconductor device structure, such as described above, comprising steps of:

providing a silicon substrate having formed thereon a GaN epi-layer stack for a plurality of GaN die, the GaN die being arranged as an array and spaced apart by dicing streets therebetween;

each GaN die comprising:

- a part of the GaN epi-layer stack comprising a GaN/AlGaN hetero-layer structure defining a two dimensional electron gas (2DEG) active layer for a lateral GaN transistor;
- a conductive metallization layer formed thereon defining source and drain electrodes of the lateral GaN transistor, and a gate electrode formed on a channel region between respective source and drain electrodes of the lateral GaN transistor, and said source, drain and gate electrodes being provided on a front-side of the epi-layer stack, an inactive region of the epi-layer stack surrounding the active region of the lateral GaN transistor; and an overlying interconnect structure comprising metallization and dielectric layers formed thereon;

defining a trench structure extending around the periphery of each die in the inactive region, and spaced laterally from the active region, the trench structure comprising a trench extending through any layers of the overlying interconnect structure, through the GaN epi-layers, and into a surface region of the silicon substrate to a depth below the interface of the GaN-epi-layers and the silicon substrate.

The method may further comprise: providing on proximal/inner sidewalls of the trench a trench lining (trench cladding) comprising as least one of a passivation layer.

Optionally, the trench cladding comprises a conductive metal layer and an overlying dielectric passivation layer The trench lining or cladding extends over an interface region of the GaN epi-layers and silicon substrate and seals exposed edges of the GaN epi-layers and the overlying dielectric layers of the interconnect structure. The trench provides a gap between the device area and the respective adjacent dicing streets.

For example, the step of defining the protective trench comprises:

- providing a trench mask to protect at least active areas of each GaN die and part of the surrounding inactive areas;
- performing a sequence of dry etching steps comprising:
  - removing any layers within the trench extending over the GaN epi-layers, removing the GaN epi-layers within the trench, and removing a surface region of the silicon substrate within the trench to a depth below the interface of the silicon substrate and the GaN epi-layers.

The method may further comprise dicing along the dicing streets, e.g. by any one of sawing, laser ablation, plasma dicing, stealth dicing, laser induced splitting/cleaving, or a combination thereof.

Preferably, the metal layer of the trench lining provides a metal barrier layer against to electro-migration of contaminant ions. Optionally, the metal layer of the trench lining is conductive and is also configured to ground the silicon substrate to the source, i.e. provides a connection between the transistor source contact area and the substrate at the bottom of the trench, or alternatively connects the substrate to a metallization layer of a protective seal ring.

In some embodiments, trenches of the pre-dicing trench structure may extend across dicing streets, i.e. between die to provide stress-relief across the wafer.

In some embodiments, e.g. wherein the lateral GaN transistor comprises a large area, multi-island transistor, the device structure further comprises a plurality of trenches defined through the die area, i.e. etched through the GaN epi-layers, in the x and y directions to divide the GaN epi-layers within the pre-dicing trench into a plurality of smaller areas or regions. This plurality of x and y trenches thereby provide intra-die stress relief across the die area.

Another aspect of the invention provides a wafer scale nitride semiconductor device structure comprising:

a silicon substrate having formed thereon an III-nitride semiconductor epi-layer stack for a plurality of III-nitride semiconductor-on-silicon die (die), said plurality of die being arranged as an array with dicing streets therebetween; each die comprising:

a part of the epi-layer stack, the epi-layer stack comprising a hetero-layer structure comprising a first and second nitride semiconductor layers of different bandgaps defining a two dimensional electron gas (2DEG) active layer for a lateral nitride semiconductor transistor or a lateral nitride semiconductor diode;

a conductive metallization layer formed thereon electrodes of the transistor or diode; said electrodes being provided on a front-side of the epi-layer stack over an active area of the die, an inactive area of the epi-layer stack surrounding said active area of each die, and an overlying interconnect structure comprising metallization and dielectric layers formed thereon; and a (pre-dicing) trench structure formed around the periphery of each die in said inactive area, the (pre-dicing) trench structure comprising a trench etched through any overlying dielectric layers of the interconnect structure, through the GaN epi-layer stack, and into a surface region of the silicon substrate to a depth below the interface region between the silicon substrate and the epi-layer stack. Optionally a trench lining is provided on proximal (inner) sidewalls of the trench, comprising at least one passivation layer, and optionally a metal layer, sealing exposed edges of the epi-layer stack and any overlying layers.

Thus, the present invention provides a nitride semiconductor device structure and a method of fabrication thereof, applicable for GaN power devices, such as lateral GaN/AlGaN HEMTs, which provides a trench structure to protect the interface region of the GaN epi-layers and silicon substrate, and thereby reduce the risk of creation of defects and/or cracks in the GaN epi-layers during wafer dicing, for improved yield and device reliability.

BRIEF DESCRIPTION OF THE DRAWINGS

In the drawings, identical or corresponding elements in the different Figures have the same reference numeral, or corresponding elements have reference numerals incremented by 100 in successive Figures.

The foregoing and other features, aspects and advantages of the present invention will become more apparent from the following detailed description, taken in conjunction with the accompanying drawings, of preferred embodiments of the invention, which description is by way of example only.

DETAILED DESCRIPTION OF EMBODIMENTS

Figure 1:
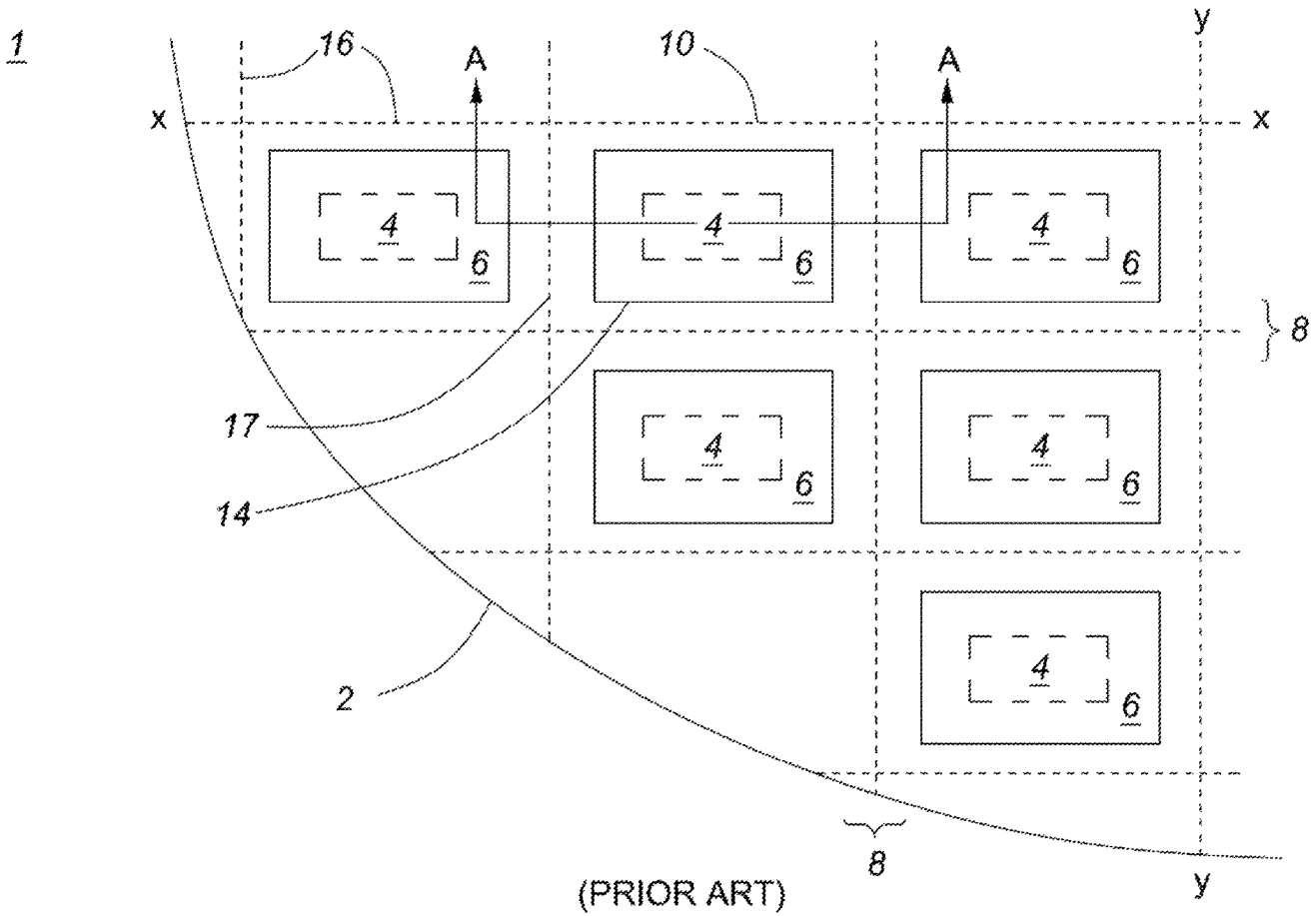
(PRIOR ART) FIG. 1
FIG. 1 (Prior Art) shows a simplified schematic diagram of a plan view of part of a silicon wafer comprising a plurality of GaN-on-Si die with dicing streets for dicing of the wafer along lines x-x and y-y.

FIG. 1 (Prior Art) shows a simplified schematic diagram of a plan view of part of a GaN-on-silicon wafer 1 comprising a silicon substrate 2 on which is defined a plurality of GaN-on-Si die 10, each comprising a GaN semiconductor device such as a GaN HEMT. The GaN-on Si-die 10 are arranged as an array, with dicing streets 8 in between each die, for die singulation by dicing of the wafer along scribe lines 16, i.e. lines in directions x-x and y-y, between adjacent die. Each die 10 comprises an active device area 4, i.e. the hetero-layer structure defining the 2DEG region on which the source, drain and gate electrodes of the GaN HEMT are formed, surrounded by an inactive area 6 which separates the active area from edges of the die 17. Optionally, a protective structure, such as a seal ring 14, may be provided around the die, in the inactive area 6, near the die edge 17. By way of example, a GaN semiconductor device structure 100, comprising a lateral GaN power transistor, is illustrated in a simplified schematic cross-sectional view shown in FIG. 2. The GaN transistor is fabricated on a silicon substrate 102. The GaN semiconductor layers 112 comprise one or more buffer layers or intermediate layers 104, a GaN layer 106, and an overlying AlGaN layer 108, which are formed epitaxially on the native silicon substrate 102. The latter may be referred to as the growth substrate. The GaN/AlGaN heterostructure layers 106/108 create a 2DEG active region 111 in device regions of the GaN-on-Si substrate. The stack of GaN epitaxial layers that is formed on the silicon substrate, i.e. intermediate layers 104, GaN layer 106, and AlGaN layer 108, and any intervening layers not actually illustrated, will be referred to below as the "epi-layer stack" or "epi-stack" 112. After formation of the epi-stack 112, source, drain and gate electrodes (S, G, D) are formed. For example, a conductive metal layer, e.g. a layer of aluminum/titanium (Al/Ti) which forms an ohmic contact with the underlying GaN heterostructure layer, is deposited to define a source electrode 120 and a drain electrode 122. A gate electrode 126, is also defined over the channel region between the source and drain electrodes, e.g. a gate electrode comprising a Schottky metal such as palladium (Pd). This device structure can be fabricated as a depletion mode (D-mode) device which is normally on, or as an enhancement mode (E-mode) device, which is normally off. For example, for a D-mode HEMT, the GaN heterostructure may comprises a layer of undoped GaN and a layer of undoped AlGaN, with the gate electrode formed on the AlGaN layer; and for an enhancement mode (E-mode) HEMT, the GaN hetero-structure would further include a p-type layer provided in the region under the gate electrode, e.g. p-type GaN or p-type AlGaN under the gate. Alternatively, a similar epi-layer stack comprising a GaN/AlGaN heterostructure, with anode and cathode electrodes provided thereon, may be used to form a high voltage/high current diode.

Figure 2:
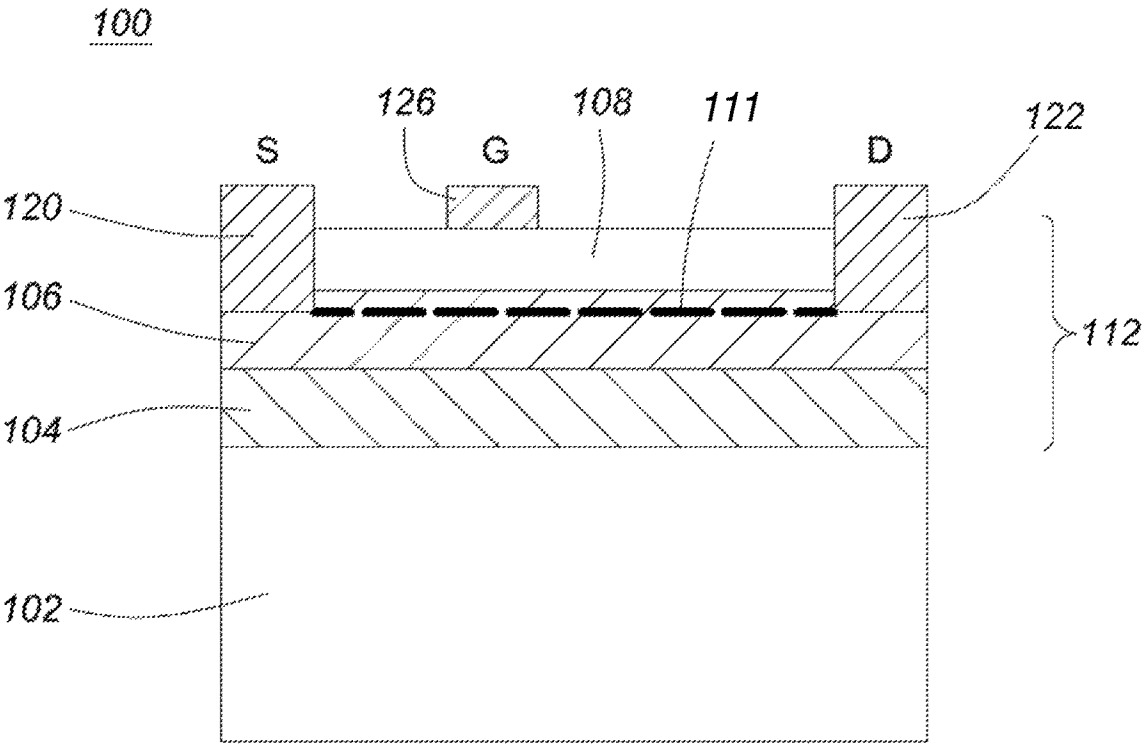
(PRIOR ART) FIG. 2
FIG. 2 (Prior Art) shows a simplified schematic cross-sectional diagram of part of a GaN-on-Si die comprising a lateral GaN power transistor comprising a GaN/AlGaN heterostructure.

For simplicity, in the GaN transistor structure illustrated in FIG. 2, only a single source electrode, drain electrode and gate electrode is illustrated, and overlying interconnect layers, i.e. one or more metallization layers and intervening dielectric layers, are not shown.

For more details of device structures, layout topologies and methods of fabrication of large area, high voltage/high current lateral GaN transistors, reference is made, for example, to U.S. Pat. No. 9,153,509 to Klowak et al. entitled "Fault Tolerant Design for Large Area Nitride Semiconductor Devices", issued Oct. 6, 2015 to GaN Systems Inc., and related references cited therein, having common ownership with this application. These references are incorporated herein by reference in their entirety.

Figure 3:
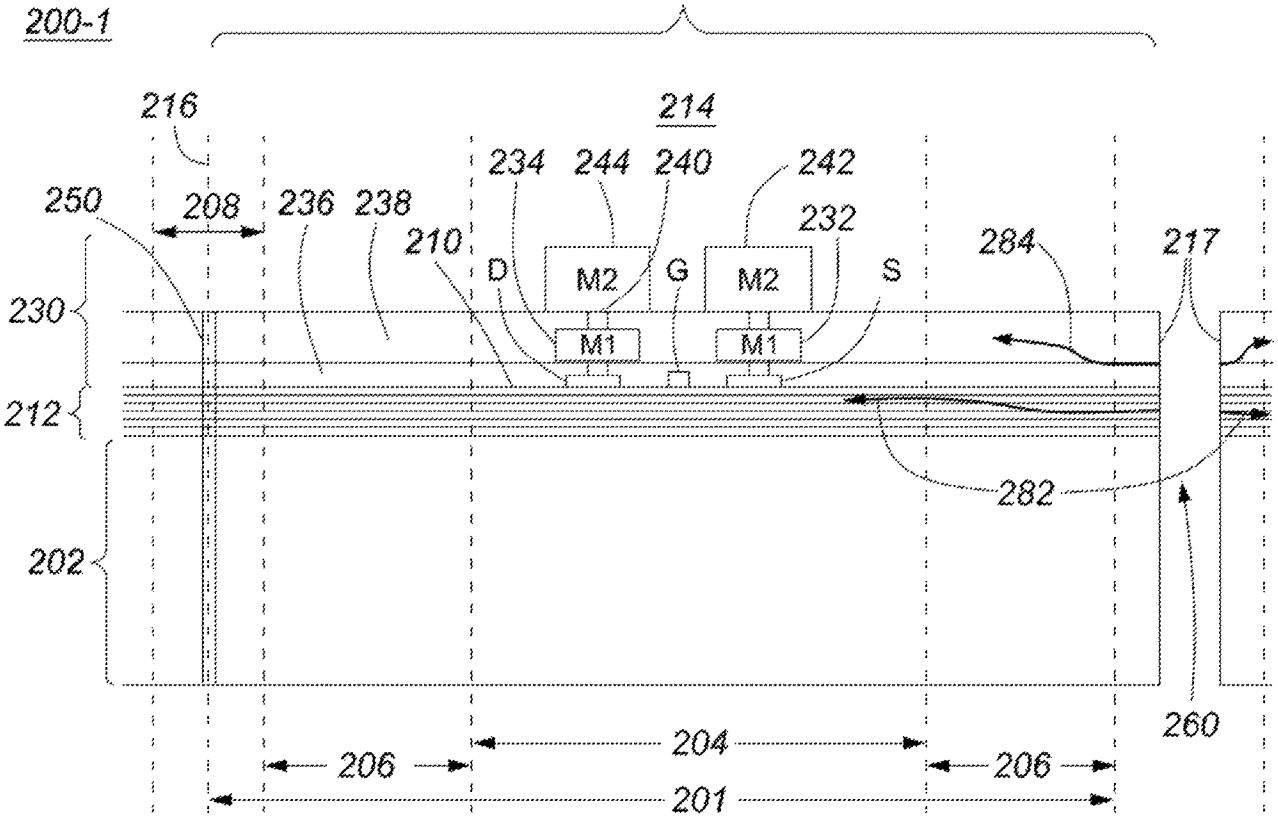
(PRIOR ART) FIG. 3
FIG. 3 (Prior Art) shows a simplified schematic cross-sectional diagram of part of a GaN-on-Si wafer comprising a die, and parts of neighbouring die, e.g. through line A-A of die 10 in FIG. 1, wherein each die comprises a lateral GaN power transistor comprising a GaN/AlGaN heterostructure, to illustrate schematically dicing induced defects and crack propagation, such as may be caused by conventional wafer sawing.

FIG. 3 (Prior Art) shows a simplified schematic cross-sectional diagram of a device structure 200-1 comprising part of the GaN-on-Si wafer 1 shown in FIG. 1, i.e. a cross-section through line A-A of FIG. 1, showing die 10 and parts of neighbouring die. Each die 10 comprises a lateral GaN power transistor 214 formed on a silicon substrate 202. The GaN transistor structure 214 comprises a plurality of GaN epitaxial layers, i.e. GaN epi-layer stack 212. The GaN epi-layer stack 212 includes a GaN/AlGaN heterostructure providing a 2DEG active region 210. Source electrode S, drain electrode D and gate electrode G of the lateral GaN transistor are formed on the 2DEG active region 210. Also shown are overlying Back End of the Line (BEOL) layers 230, i.e. comprising first and second metallization layers, M1 and M2, which define source contacts 232 and 234 and drain contacts 242 and 244, and intervening dielectric layers 236 and 238. Conductive vias 240 interconnect the source and drain electrodes (S, D) to respective overlying metallization layers M1 and M2, and M2 provides external source and drain contact pads 242, 244. For simplicity, similar to FIG. 2, only a single source electrode S and drain electrode D are shown, and the interconnections from the gate electrode G to an external gate contact pad are not illustrated.

Although only one transistor element is illustrated for die 10 in the simplified schematic cross-sectional view in FIG. 3, it will be appreciated that large area, multi-island lateral GaN HEMTs may be provided, e.g. as disclosed in the above mentioned U.S. Pat. No. 9,153,509 As is conventional, many GaN-on-Si die are patterned on a single, large area silicon substrate wafer and the wafer is then diced to provide separate individual GaN-on-Si die, as illustrated schematically in FIG. 1.

As shown schematically in FIG. 3, the die area 201 comprises an active area of the device 204 surrounded by an inactive area 206. The latter extends into dicing streets 208 along each of the four sides of the die 10. During die singulation, the wafer is diced along scribe lines 216, e.g. using conventional sawing or laser grooving, a combination thereof, to cut through all layers of the wafer as indicated by line 250, representing the kerf of a saw blade or laser groove. Thus, when die are separated as indicated at 260, the diced edges 217 of the die expose edges of the BEOL layers 230 and expose edges of the plurality of layers forming the GaN epi-layer stack 212. As mentioned above, interlayer stresses due to lattice mismatch of the GaN epi-layers and the silicon substrate can cause propagation of dicing induced defects and cracking of both the epi-layer stack and the BEOL dielectric layers, i.e. causing cracks 282 in the epi-layers 212 and cracks 284 in the dielectric layers 236 and 238. If these dicing induced defects and cracks are not detected during device testing, these defects and/or cracks can potentially migrate into active regions 204 of the device, and the reliability of the device is then compromised.

Figure 4:
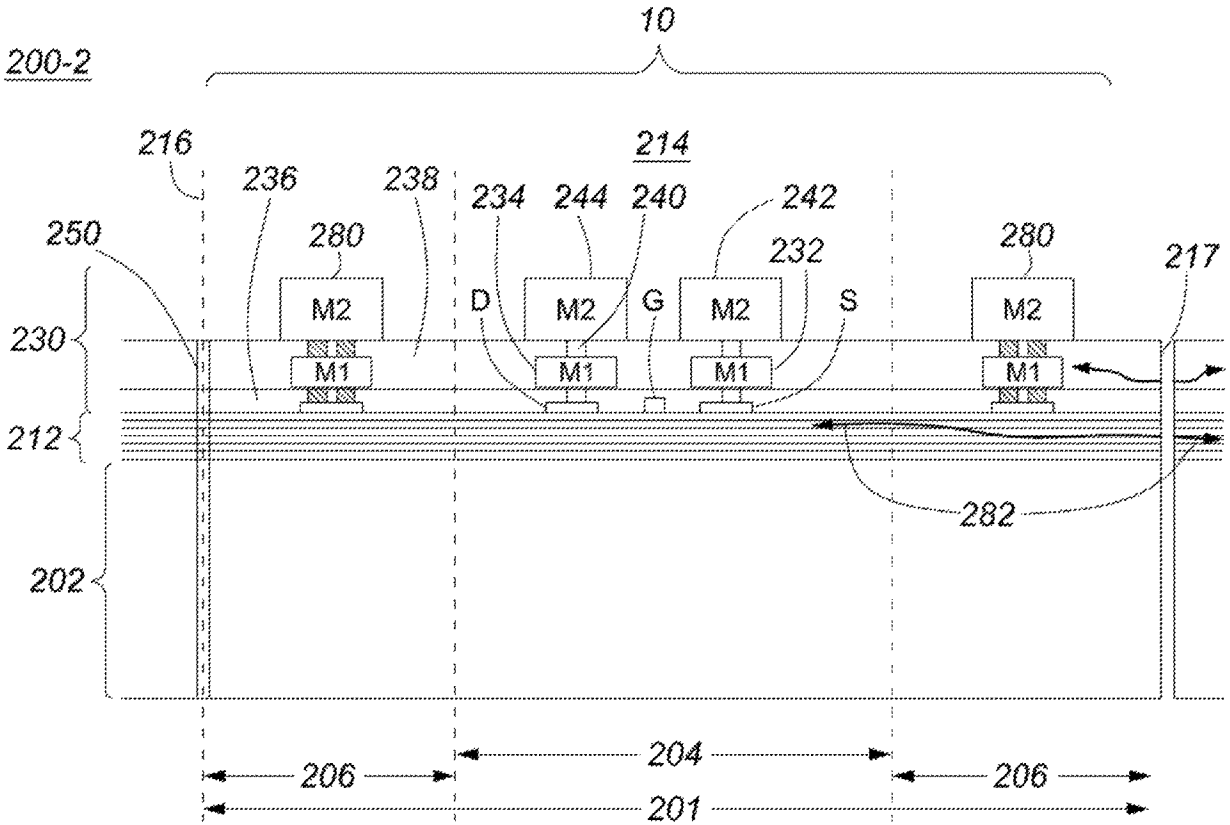
(PRIOR ART) FIG. 4
FIG. 4 (Prior Art) shows a simplified schematic cross-sectional diagram of part of a GaN-on-Si wafer comprising a die, and parts of neighbouring die, e.g. through line A-A of die 10 in FIG. 1, wherein each die comprises a lateral GaN power transistor comprising a GaN/AlGaN heterostructure and a surrounding seal ring, to illustrate schematically dicing induced defects and crack propagation, such as may be caused by conventional wafer sawing.

Optionally, the die 10 further comprises a seal ring 280 extending around the periphery of the die, as illustrated schematically for the device structure 200-2 in FIG. 4. Many elements of FIG. 4 are similar to those of FIG. 3 and are labelled with the same part numbers. The seal ring 280 comprises part of the BEOL layers 230 and is formed over the inactive device area 206 which surrounds the active device area 204. The seal ring structure 280 helps to reduce crack propagating into active areas of the device interconnect layers, and also helps to block electro-migration of contaminant ions. However, as illustrated, the diced edges 217 of the epi-layer stack are exposed after wafer singulation. As described with respect to the structure shown in FIG. 3, any dicing induced defects and cracks 282 can potentially migrate into active regions of the transistor, leading to reliability issues.

In FIGS. 2 to 4, the thicknesses and other dimensions of the layers are not shown to scale. Typically the GaN epi-layer stack has a thickness of about 2 μm to 6 μm, while the silicon substrate may have a thickness of 200 μm to 500 μm or more. The silicon substrate may be thinned somewhat during wafer post-processing after fabrication of the semiconductor layers is completed. For a large area high voltage/high current lateral GaN transistor, the die size may be in the range from ~10 $mm^2$ to ~100 $mm^2$, e.g. about 2 mm×6 mm or 10 mm×10 mm. The dicing streets between the die may be 60 μm to 120 μm wide, for example. An inactive region, e.g. having a width of in a range from about 25 μm to about 80 μm, typically extends around the active 2DEG region of the transistor, to separate the active region of the transistor from the diced edges of the die. Where a seal ring 280 is provided, as illustrated in FIG. 4, it may similarly have a width in a range from about 20 μm to 30 μm, and provides further lateral separation between the die edge and the active region of the lateral GaN transistor. Typically the seal ring would be spaced about 20 μm to 30 μm from the die edge, and spaced at least 5 μm, and perhaps 20 μm to 30 μm, from the active region.

Figure 5:
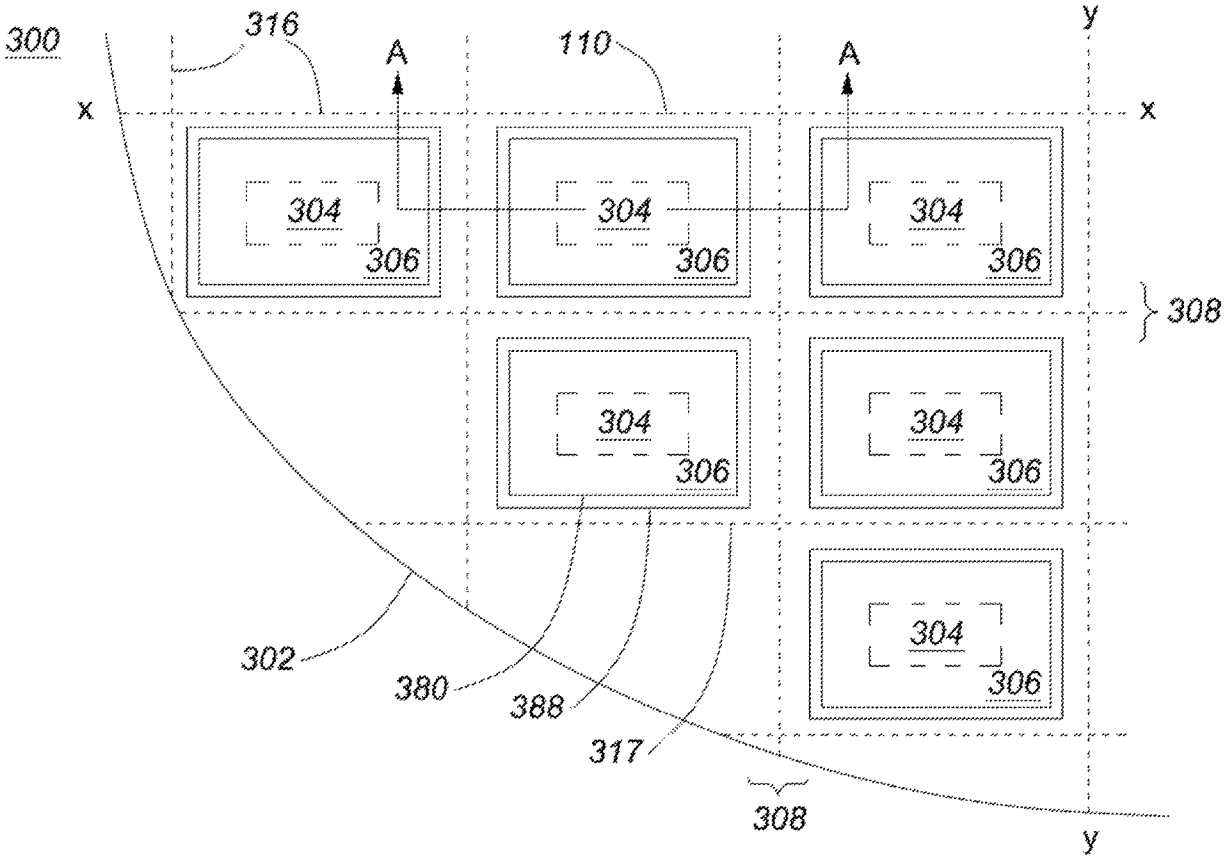
FIG. 5 shows a simplified schematic diagram of a plan view part of a silicon wafer comprising a plurality of GaN-on-Si die with dicing streets for dicing of the wafer along lines x-x and y-y, and further comprising a pre-dicing trench according to an embodiment of the present invention.

FIG. 5 shows a simplified schematic diagram of a device structure comprising part of a GaN-on-silicon wafer 300 according to an embodiment of the present invention, comprising a silicon substrate 302 on which is defined a plurality of GaN-on-Si die 110, arranged as an array, with dicing streets 308 in between each die, for die singulation by dicing of the wafer along scribe lines 316, i.e. lines in directions x-x and y-y, between adjacent die. Each die 110 comprises an active device area 304 surrounded by an inactive area 306. Optionally, a protective structure such as a seal ring 380 may be provided around the die in inactive area 306, near the die edge 317.

A pre-dicing trench 388 is formed around the periphery of the chip, i.e. around all edges of the die, on the inactive area adjacent to, or close, to the die edge. As illustrated schematically, the trench lies between the seal ring 380 and the die edge 317.

Figure 6:
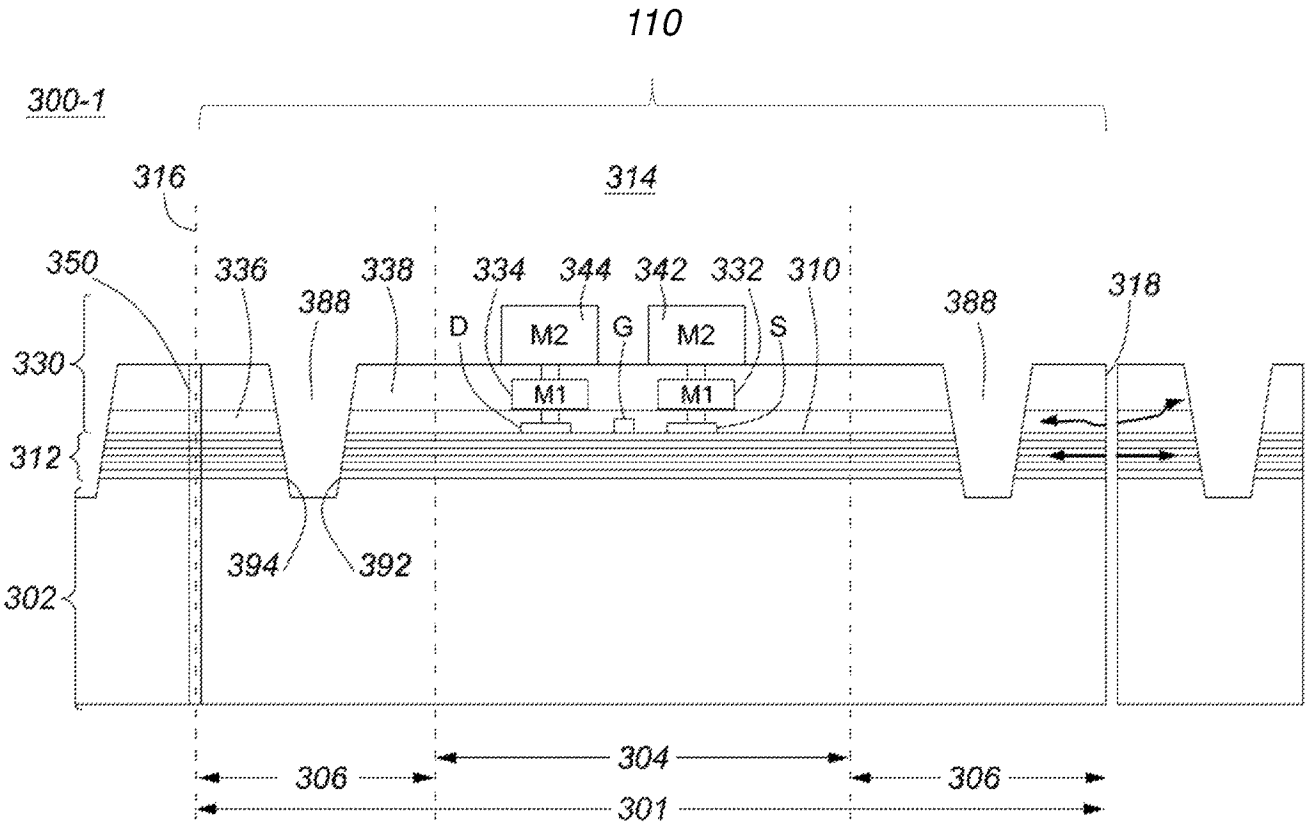
FIG. 6 shows a simplified schematic cross-sectional diagram of part of a GaN-on-Si wafer comprising a die, and parts of neighbouring die, e.g. through line A-A of die 110 in FIG. 5, wherein each die comprises a lateral GaN power transistor comprising a GaN/AlGaN heterostructure and a pre-dicing trench formed around the periphery of the die, according to a first embodiment of the present invention.

FIG. 6 shows a simplified schematic cross-sectional diagram of a device structure 300-1 comprising part of the GaN-on-Si wafer 300 of the first embodiment, e.g. a cross section through A-A of FIG. 5 showing die 110 and parts of neighbouring die.

Many elements of FIG. 6 are similar to those of FIG. 3 and are labelled with the same part numbers incremented by 100. That is, each die 110 comprises a lateral GaN power transistor 314 formed on a silicon substrate 302. The GaN transistor structure 314 comprises a plurality of GaN epitaxial layers, i.e. GaN epi-layer stack 312. The GaN epi-layer stack 312 includes a GaN/AlGaN heterostructure providing a 2DEG active region 310. Source electrode S, drain electrode D and gate electrode G of the lateral GaN transistor are formed on the 2DEG active region 310. Also shown are overlying Back End of the Line (BEOL) layers 330, i.e. comprising first and second metallization layers M1 and M2, which define source contacts 332 and 334 and drain contacts 342 and 344, and intervening dielectric layers 336 and 338. Conductive vias 340 interconnect the source and drain electrodes (S, D) to respective overlying metallization layers M1 and M2, and M2 provides external source and drain contact pads 342, 344.

The device structure of this embodiment further comprises a trench 388 etched around the periphery of each die area 301. The trenches 388 extend into the silicon substrate and are formed prior to wafer dicing. These trenches will be referred to as pre-dicing trenches. The trenches separate the active area of each die 304, and part of the surrounding inactive area 306, from the dicing street 316. For example, the trenches 388 have a width in the range of about 15 μm to 20 μm, to provide an aspect ratio of 3:1 or 4:1. Thus, as illustrated schematically in FIG. 6, after dicing, any dicing induced defects or cracks 382, 384 are blocked by the trench from propagation or migration into the active area 304 of the device structure.

Figure 7:
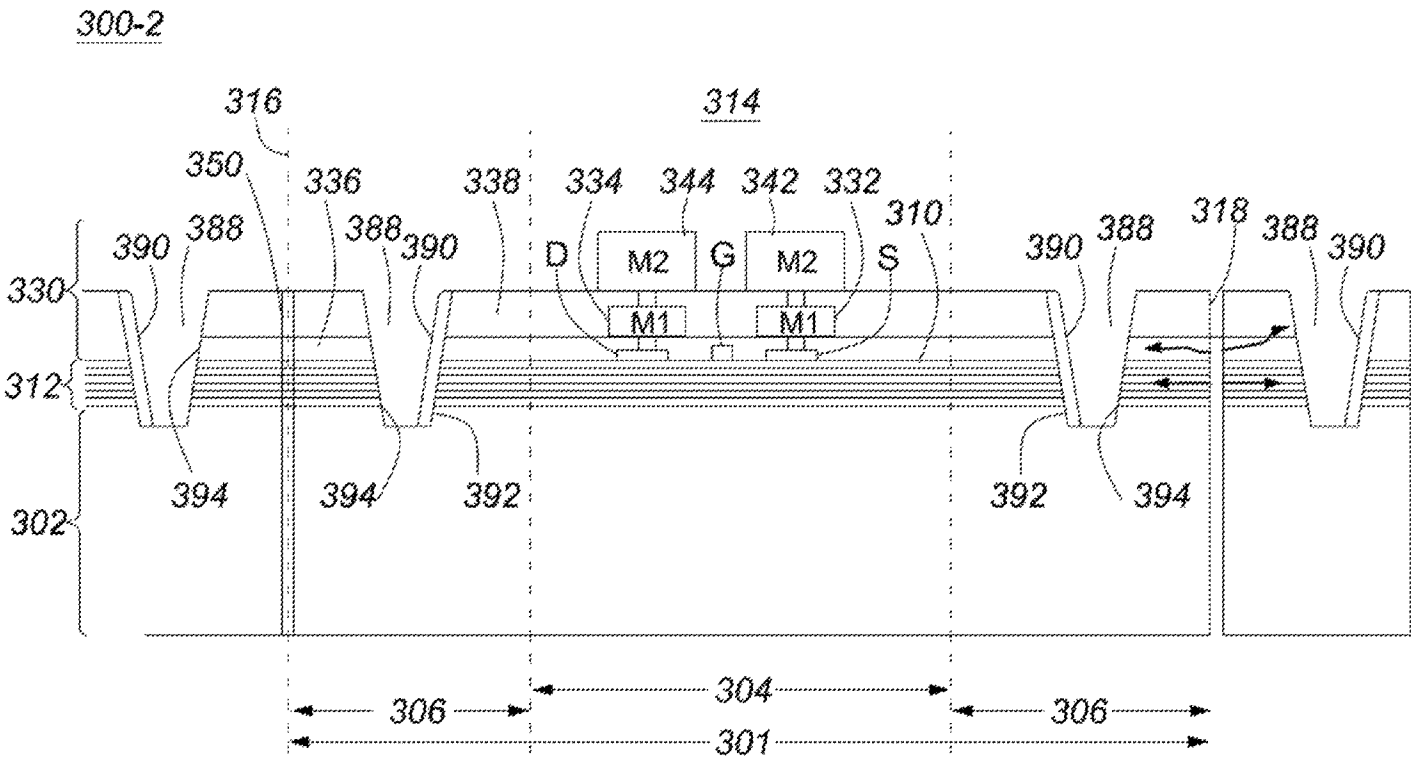
FIG. 7 shows a simplified schematic cross-sectional diagram of part of a GaN-on-Si wafer comprising a die, and parts of neighbouring die, wherein each die comprises a lateral GaN power transistor comprising a GaN/AlGaN heterostructure, a pre-dicing trench formed around the periphery of the die and a protective edge sealing layer formed on inner (proximal) sidewalls of the pre-dicing trench, according to a second embodiment of the present invention.

As illustrated in FIG. 7, a device structure 300-2 according to a second embodiment is similar to that shown in FIG. 6, and similar elements are labelled with the same references numerals as FIG. 6. Additionally, in the device structure of this embodiment, a trench cladding 390 (trench lining) comprising an edge sealing layer or protective layer, is provided on at least the inner or proximal side walls 392 of the pre-dicing trenches 388, surrounding each die. The trench cladding 390 may comprise one or more conformal dielectric layers, and optionally a metal layer, provided on the inner (proximal) sidewalls 392 of the trench, which seal any exposed edges of the epi-layer stack and overlying BEOL layers. In referring to inner sidewalls 392 of the trench 388, this means the sidewalls which are proximal to the centre of the die. The outer (distal) sidewalls 394 are closer to the edge of the die.

Figure 8:
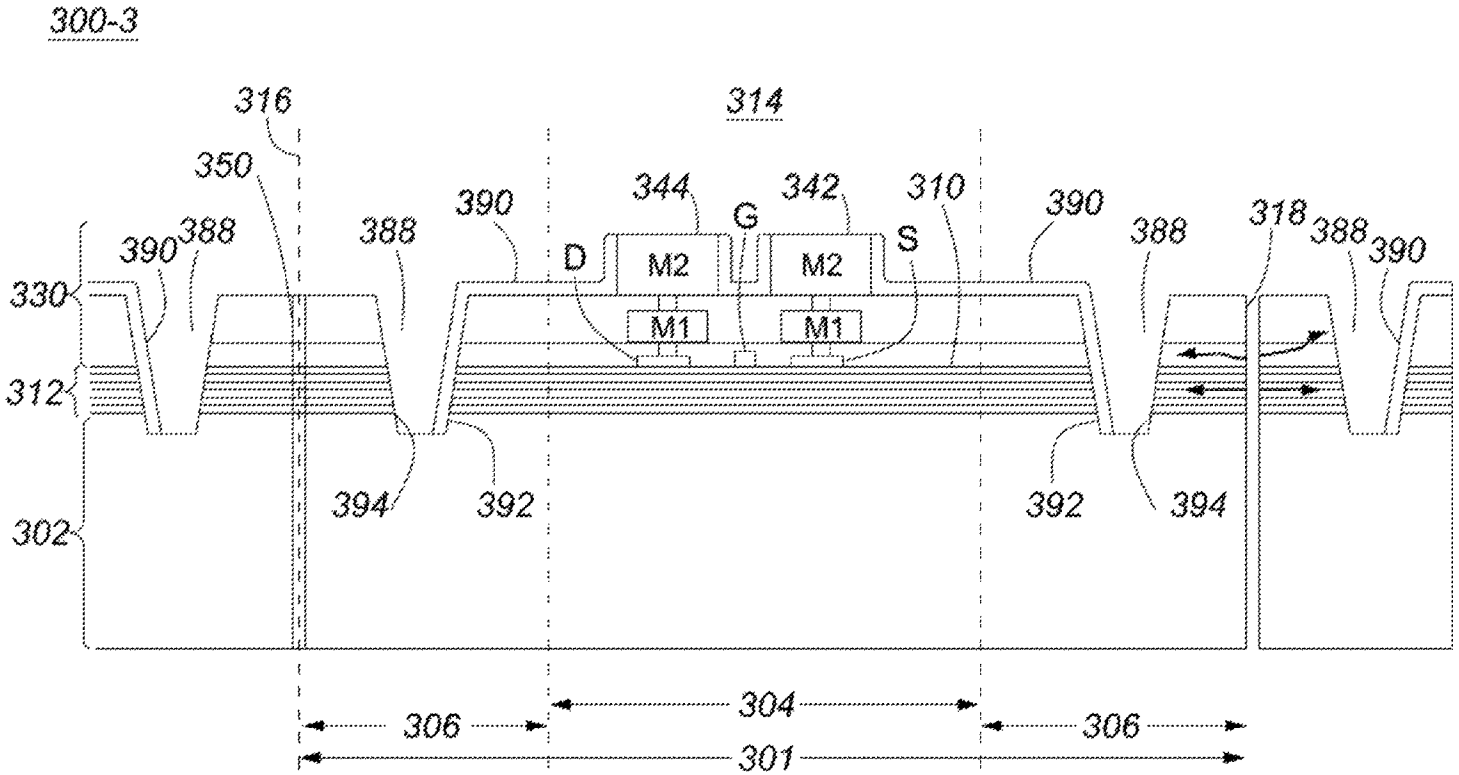
FIG. 8 shows a simplified schematic cross-sectional diagram of part of a GaN-on-Si wafer comprising a die, and parts of neighbouring die, wherein each die comprises a lateral GaN power transistor comprising a GaN/AlGaN heterostructure and pre-dicing trench formed around the periphery of the die, and a protective edge sealing layer formed conformally over the active region of the die and extending over the inner (proximal) sidewalls of the pre-dicing trench, according to a third embodiment of the present invention.

As illustrated in FIG. 8, in a device structure 300-3 according to a third embodiment, the cladding 390 is provided as a conformal layer or layers extending over the surface of the GaN-on-Si die, and extending over inner sidewalls of the pre-dicing trenches. Other elements of the device structure 300-3 shown in FIG. 8 are similar to those shown in FIGS. 6 and 7 and are labelled with the same reference numerals. The cladding 390 may comprise, e.g. one or more dielectric layers such as silicon dioxide $SiO_2$ or silicon nitride $Si_3N_4$. Optionally, the cladding further comprises a metal layer. The metal layer preferably acts as a barrier against electro-migration of contaminant ions. If a metal layer is provided, there would also be an overlying dielectric passivation layer, e.g. silicon nitride to protect the metal layer against mechanical and environmental damage. The structures shown in FIGS. 6 to 8 may optionally include a seal ring, such as illustrated schematically in FIG. 4.

If required, the metal layer of the trench cladding 390 connects the substrate within the trench to a source electrode of the transistor, or, if a seal ring is provided, connects the substrate to metal layers of the seal ring.

FIGS. 9 to 13 show a series of simplified schematic cross-sectional diagrams to illustrate an exemplary process flow for fabrication of a nitride semiconductor device structure 400 comprising a lateral GaN transistor 414 according to an embodiment of the present invention, similar to that illustrated in FIG. 8, and further comprising a seal ring 480. The seal ring is similar to that illustrated in FIG. 4.

Figure 9:
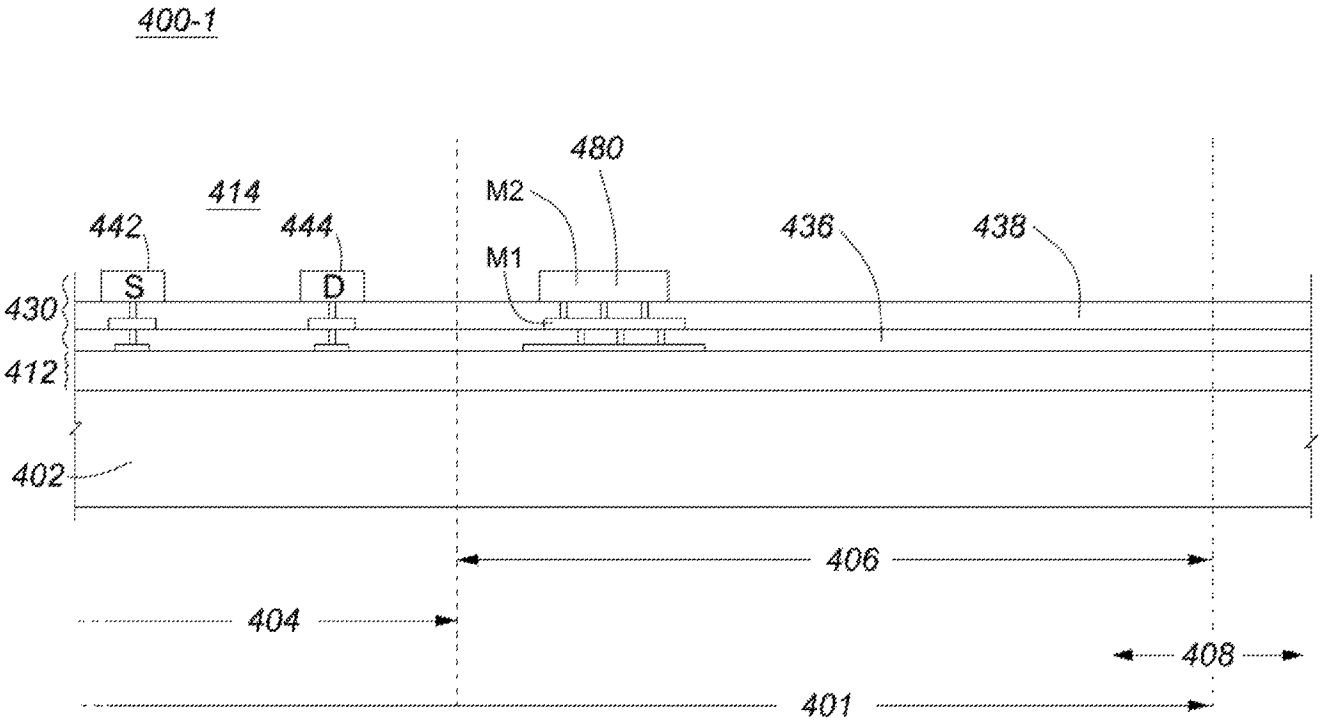
FIGS. 9 to 13 shows a series of simplified schematic cross-sectional diagrams through part of a GaN-on-Si wafer to illustrate a process flow for fabrication of a GaN device structure comprising a lateral GaN power transistor comprising a GaN/AlGaN heterostructure with a surrounding seal ring, and pre-dicing trench, according to fourth embodiment of the present invention.
Figure 10:
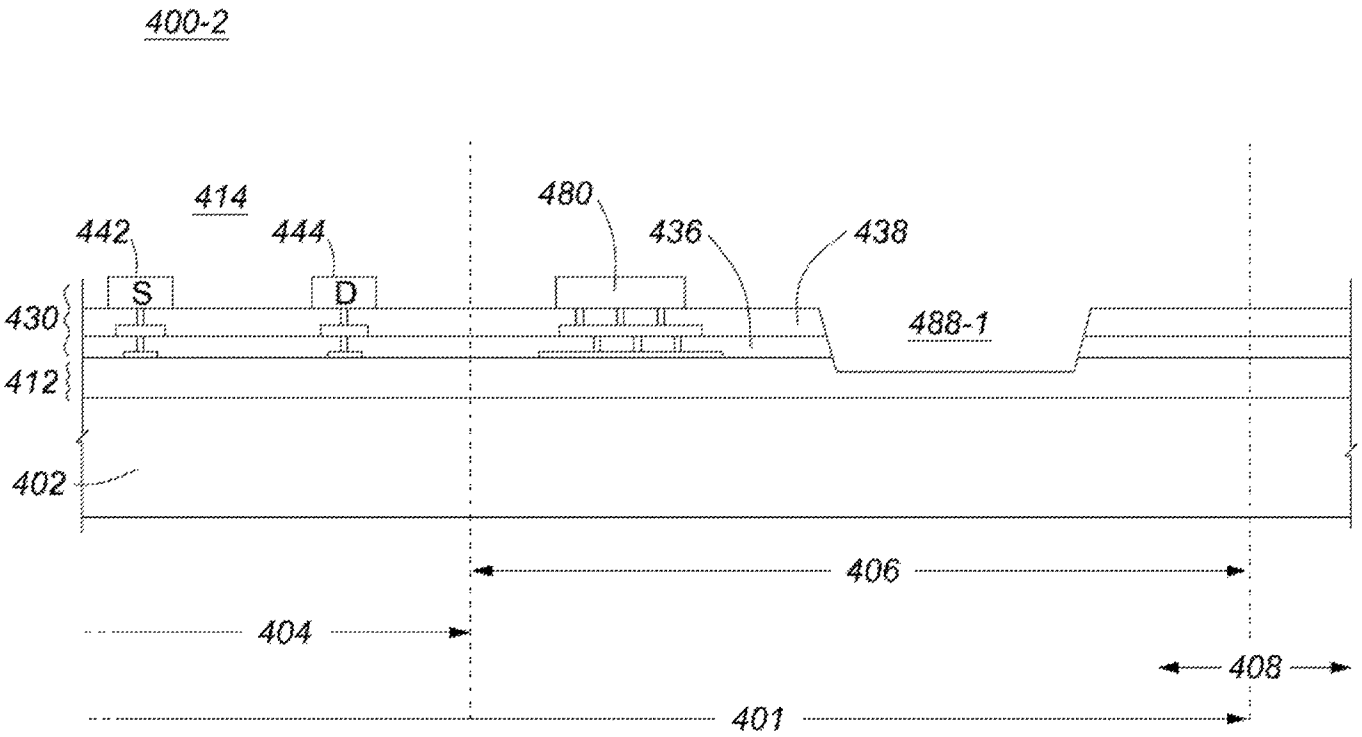
Figure 11:
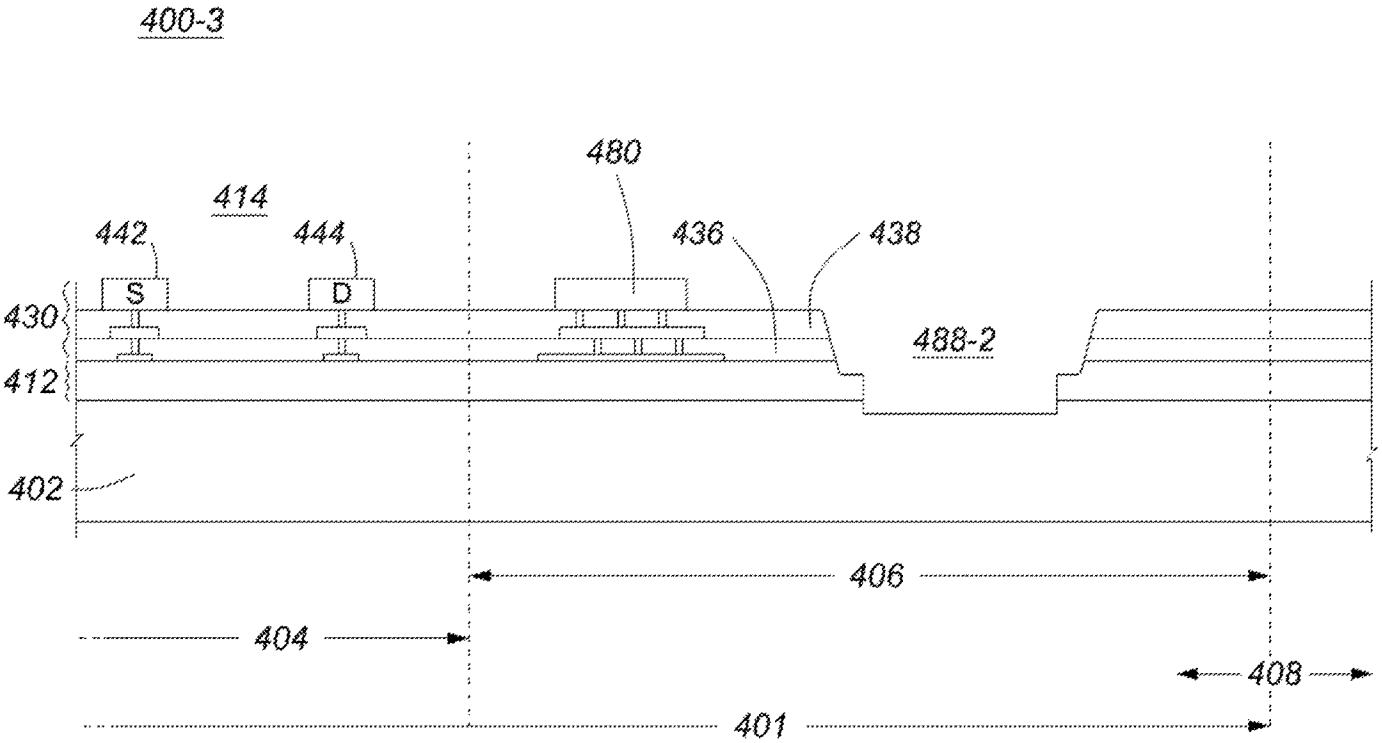

As illustrated for the device structure 400-1 shown schematically in FIG. 9, a GaN epi-layer stack 412 is provided on a substrate 402, and device fabrication proceeds as conventionally, to completion of the BEOL layers 430 forming the on-chip interconnect structure comprising the on-chip metallization layers M1 and M2 and intervening dielectric layers 436 and 438 forming the interconnect metallization for the GaN transistor 414, including source 442 (S), drain 444 (D) and the surrounding seal ring 480. Then, for structures 400-2 and 400-3, as shown in FIGS. 10 and 11 respectively, a pre-dicing trench structure 488 is defined in the inactive region 406 between seal ring 480 and the edge of the GaN die. The pre-dicing trench structure is formed by dry etching through to the silicon substrate, using a sequence of dry etch steps. For example, a first etch process removes any layers overlying the GaN epi-layers in the trench, as illustrated in FIG. 10, forming a first portion of the trench 488-1. Then a second etch process removes the GaN epi-layers in the trench, and removes a surface region of the silicon substrate, e.g. to etch several microns into the silicon substrate, to form a deeper trench structure 488-2 as illustrated in FIG. 11.

Figure 12:
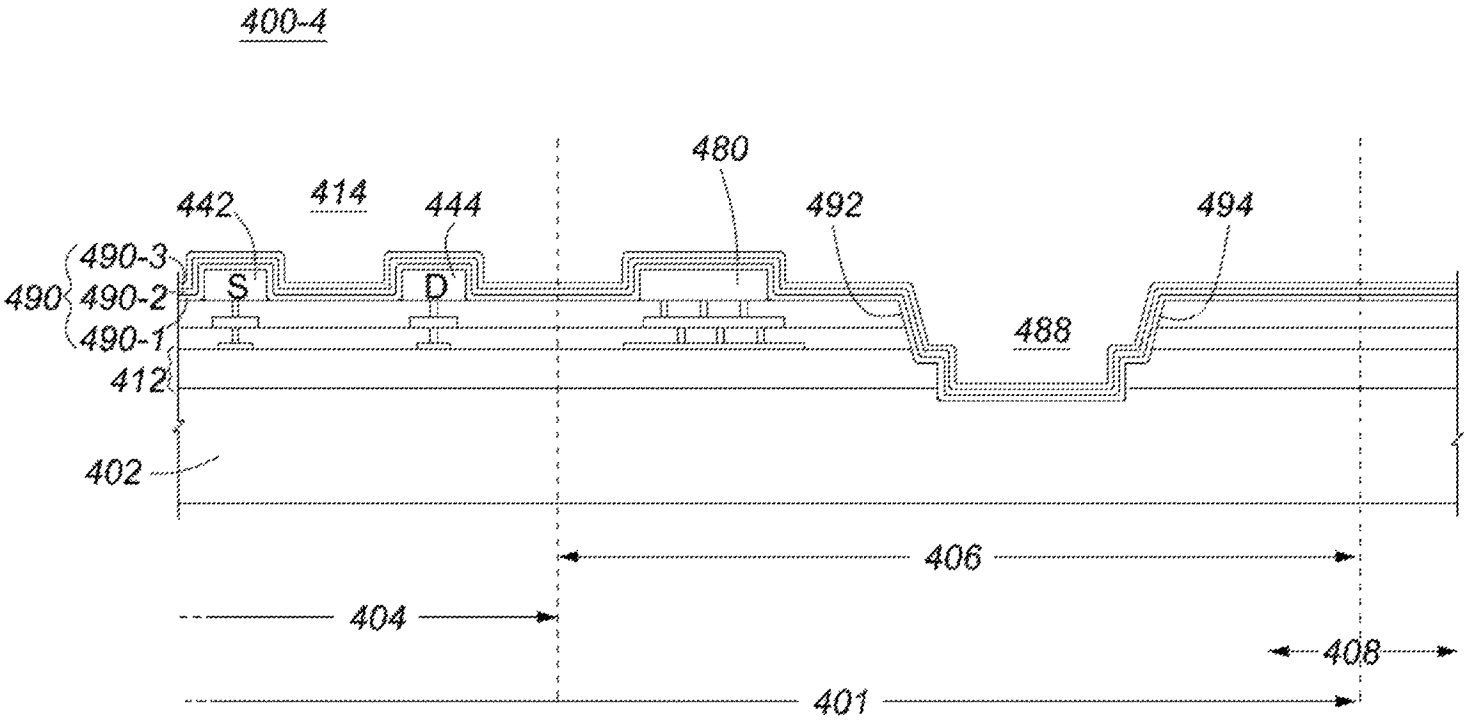
Figure 13:
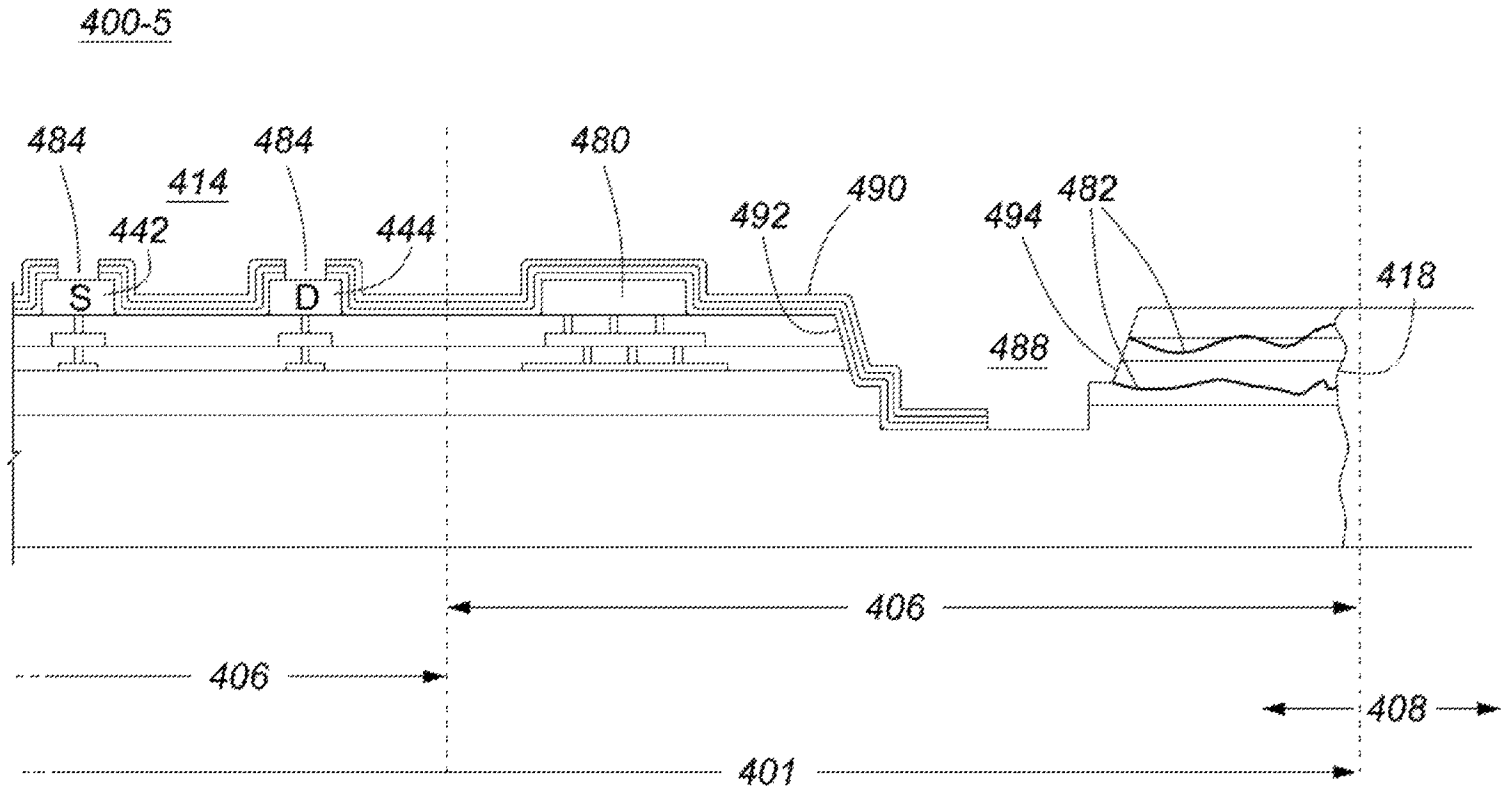

As illustrated in FIGS. 9 to 13, an inactive region 406 of the GaN epi-layers surrounds the 2DEG active regions 404 in the GaN epi-layers of the transistor structure, and as shown in FIG. 13 the trench 488 extends through the inactive region of the GaN epi-layers. Thus, the trench 488 is separated from the edge of the active 2DEG region by the inactive area 406, and is positioned between the active region/area 404 of the GaN transistor and the dicing street 408 at the die edge.

In this embodiment, the trench is shown as having tapered or sloping sides formed by a first etch process and steep sides, e.g. as formed by an anisotropic etch, towards the bottom of the trench. At least part of the sides of the trench may alternatively be straight sided and/or tapered (sloped), depending on the type of etchant and etch process.

The trench lining or cladding 490 is then formed, as illustrated by device structure 400-4 shown in FIG. 12, comprising at least one passivation layer and optionally a conductive metal layer. The trench lining covers at least the inner sidewalls 492 or "proximal sidewalls" of the trench surrounding and spaced from the active region of the transistor. As illustrated schematically in FIG. 12, the trench lining 490 comprises a plurality of conformally deposited passivation layers 490-1, 490-2 and 490-3, such as a layer of silicon dioxide and/or a layer of silicon nitride, which are provided all over the exposed surfaces of the wafer, to seal the surface of the wafer. As illustrated schematically for the device structure 400-5 in FIG. 13, the conformal layers 490 are then selectively removed to expose source and drain contact pads 484, and the conformal layers are also removed to expose part of the bottom of the trench and the trench sidewalls 494 and die area closest to the dicing street 408. This clears the passivation dielectrics from the scribe street prior to wafer dicing, and leaves the layers of passivation dielectric conformally coating and sealing edges of the exposed backend dielectric layers and the exposed edges of the epi-layer stack. The wafer is subsequently diced, to singulate individual die, i.e. cut through any overlying BEOL layers, the GaN epi-layers and the silicon substrate between the pre-dicing trenches, using any suitable dicing method. For conventional wafer sawing, the remaining portion of the BEOL layers and epi-layers in the dicing street serve as sacrificial layers during dicing, to reduce risk of surface chipping or other dicing induced damage into the silicon substrate at the sawn edge 418.

As shown schematically, propagation of any dicing damage or cracks 482 near the sawn or cut edge of the die is blocked by the gap resulting from placement of trench near the die edge.

The passivation layers which protect exposed surfaces of the GaN epi-layers may be a dielectric such as silicon nitride or silicon dioxide. If provided, a conductive metal layer may be the same as that used for other on-chip metallization layers, and preferably provides a barrier layer against electro-migration of mobile ions. Thus, the trench lining or cladding forms a barrier layer to reduce risk of contaminant ions penetrating the active region and causing device parametric shifts over long term.

Where the trench lining comprises a conductive metal layer, the metal layer may be extended to connect the source of the transistor to the substrate, i.e. to ground the substrate. Alternatively, if the die comprises a seal ring, the metal layer may connect the substrate to metallization layers of a seal ring. Preferably a passivation layer of dielectric, e.g. silicon nitride is provided over the metal layer. Thus, the trench lining forms a protective layer over edges of the GaN epi-layer, and over edges of the BEOL layers, which would otherwise be exposed during conventional wafer dicing.

In the process flow described above, since the pre-dicing trench structure, and its protective trench lining, are formed after completion of on-chip interconnect and dielectric layers, wafer fabrication of the GaN-on-Si die can proceed as is conventional up to that point.

The additional steps required to form the trench structure comprise providing a suitable etch mask over the active device areas, exposing the areas to be trenched, and then removing layers of material within the trench by one or more Reactive Ion Etching (RIE) steps. For example a first etch step is performed to remove all oxide layers, etch stopping on the top of the GaN epi-layer stack. Then a second etch is performed to remove the GaN epi-layer stack within the trench. This etch is stopped well into the silicon substrate, e.g. 2 μm or more below the interface between the silicon substrate and layer of the epi-layer stack. By way of example, the step of removing the GaN epi-layers from the trench uses an etching process, such as RIE, or preferably ICP (Inductively Coupled Plasma) or ECR (Electron Cyclotron Resonance) etching with a chlorine containing gas mixture, such as $BCl_3$, $SiCl_4$ plus an inert gas such as Ar, wherein gas mixtures and energies are selected to control the isotropy/anisotropy of the etch to produce steep or sloped sidewalls, as required. Preferably, the etch process is capable of cleanly exposing edges of the GaN epi-layers in the sidewalls of the trench without creating significant defects or etch damage, i.e. so as to avoid initiating cracks in the GaN epi-layers. As mentioned above, the sidewalls of the pre-dicing trench may have steep sides or be tapered, as appropriate, depending on the materials used for the trench lining. The trench lining may extend partly over the bottom of the trench. Alternatively, the trench lining may be provided only on the proximal (inner) sidewalls of the trench, and/or the trench lining may be removed from the bottom of the trench before subsequent dicing of the silicon substrate.

Figure 14:
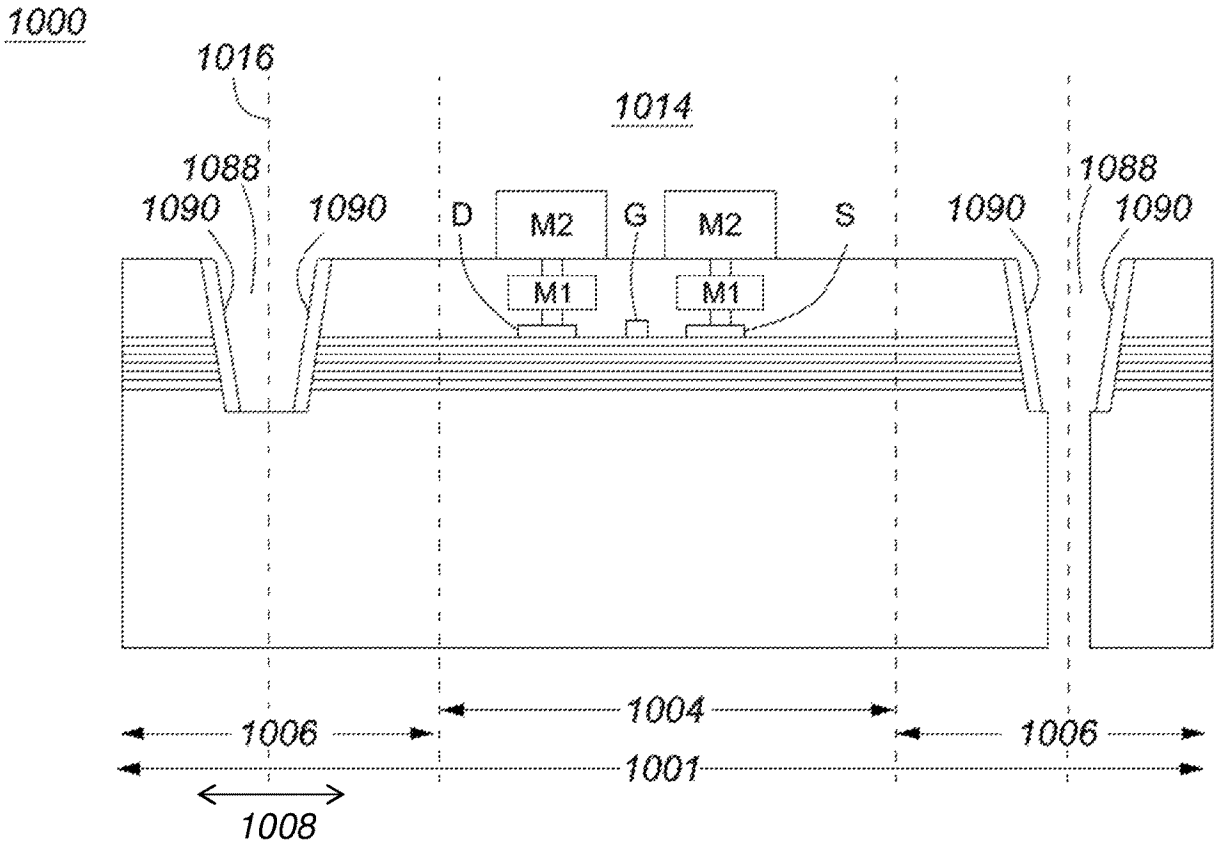
FIG. 14 shows a simplified schematic cross-sectional diagram of part of a GaN-on-Si wafer comprising a lateral GaN transistor, according to another embodiment of the present invention.

In a device structure 1000 comprising a lateral GaN transistor 1014 according to another embodiment, as shown in FIG. 14, the device structure has some elements similar to those shown in FIGS. 5 and 6, i.e. active area 1004 of the device area 1001 is surrounded by an inactive region 1006, and the transistor 1014 comprises electrodes for the source S, drain D, and gate G and respective contacts formed by first and second metal layers M1 and M2. However, instead of a pre-dicing trench being formed around the periphery of each individual die, in this embodiment, a single pre-dicing trench 1088 is etched along the scribe line 1016 between each die, and shared between adjacent die. If required, the trench may be etched across a substantial part of the width of the dicing street. 1008, each side of scribe line 1016. After providing a trench cladding 1090 on proximal sidewalls of each die, i.e. as described with reference to device structures of the embodiments described above, e.g. with reference to FIGS. 9 to 13, the individual die are then singulated using any suitable dicing process, e.g. laser grooving through the substrate within the pre-dicing trench 1088.

Figure 15:
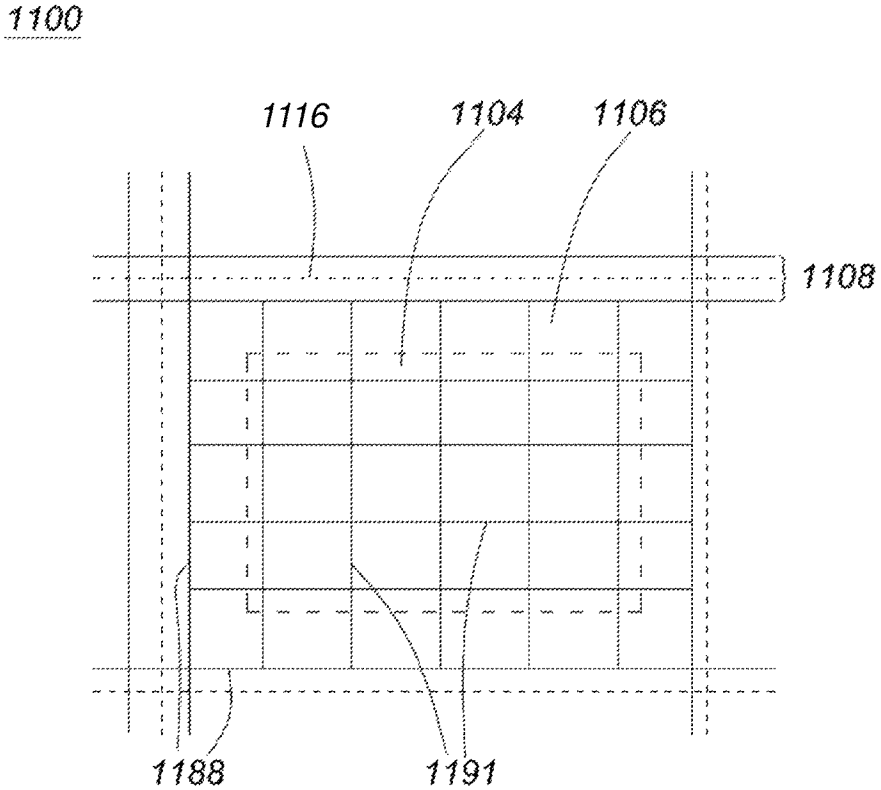
FIG. 15 shows a simplified schematic cross-sectional diagram of part of a GaN-on-Si wafer comprising a lateral GaN transistor according to yet another embodiment of the present invention.

As illustrated schematically in FIG. 15, a GaN-on-Si device structure 1100, according to yet another embodiment, comprises a large area high voltage/high current lateral GaN transistor which provides a trench structure for stress relief across the wafer, and within each die area. That is, the die comprises an active area 1104, surrounding inactive region 1106, pre-dicing trench 1188 and scribe lines 1116, and the pre-dicing trench 1188 around the periphery of each die is extended to run through the dicing streets 1108 to relieve stress across the wafer, and reduce wafer bowing. Optionally, and in addition to the trench 1188 around the periphery of each die, a plurality of intra-die stress-relieving trenches 1191 are etched in x and y directions across each die. The intra-die stress relieving trenches are similarly structured to the pre-dicing trenches described above, in that they extend through the GaN epi-layer stack, several microns into the silicon substrate, and trench cladding is preferably provided to seal exposed edges of the layers of the GaN epi-layer stack. Each transistor die is thereby divided into a number of smaller areas, e.g. 4×5=20 areas, as illustrated schematically. For example, where the GaN device comprises a large area, multi-island transistor, such as described in U.S. Pat. No. 9,153,509, each smaller area defined trenches may accommodate a plurality of GaN transistor islands, or an individual transistor island. One or more overlying metallization layers, e.g. an on-chip metal layer and/or a post-processing layer such as copper Redistribution Layer (Cu RDL) is provided to interconnect individual islands.

In this structure, the inter-die and intra-die stress relieving trenches may be formed earlier in the process flow, e.g. before formation of the overlying BEOL metallization and dielectric layers. The trenches then divide the epi-layer stack into multiple smaller areas, so that the total integrated tensile stress across the wafer is relieved, and beneficially, wafer bowing is reduced. Wafer bowing tends to increase with increasing thickness of the GaN epi-layers, and this can create issues for focussing, alignment and registration in subsequent photo-lithography steps, particularly for large diameter substrate wafers. By mitigating wafer bowing, ideally substantially eliminating wafer bowing so the wafer lies flat, subsequent photo-lithography steps are facilitated.

Thus, nitride semiconductor device structures comprising high voltage, high current GaN power transistors, and methods of fabrication thereof, according to embodiments of the present invention are disclosed, wherein a GaN semiconductor device comprises a GaN epi-layer stack on a silicon substrate (GaN-on-Si die) and wherein pre-dicing trench structure are provided around each die, to reduce risk of GaN epi-layer cracking during die singulation and for improved device yield and reliability. Advantageously, a trench lining or cladding on inner sidewalls of the trench, comprising one or more dielectric layers, and optionally a metal layer, seals edges of the layers of the epi-layer stack, and edges of the back-end dielectric layers. Additionally, and optionally, further stress relieving intra-die trenches are provided to divide the epi-layer stack of each die into a plurality of regions, each comprising one or more transistor islands.

While nitride semiconductor device structures, according to embodiments of the present invention, have been described in detail with reference to lateral GaN transistors, such as a high voltage/high current GaN HEMTs, comprising GaN/AlGaN hetero-layer structures, it will be apparent that nitride semiconductor device structures according to alternative embodiments may comprise lateral GaN power transistors and/or diodes. More generally, a nitride semiconductor device comprises a III-nitride semiconductor, that is, a compound semiconductor which includes nitrogen and at least one group III element, such as GaN, AlGaN, AlN, InGaN, InAlGaN, and the nitride semiconductor device structure comprises a hetero-layer structure comprising first and second nitride semiconductor layers of different bandgaps, that forms an active region comprising a two dimensional electron gas (2DEG) region for transistors and/or diodes.

The device structures, and methods of fabrication thereof, described herein are particularly applicable to large area lateral GaN transistors and diodes for high current and high voltage applications, e.g. where it may be desirable to provide a relatively thick GaN epi-layer-stack, e.g. 6 μm for increased breakdown voltage, on a low cost silicon substrate. The trench structure helps to reduce interlayer stresses resulting from lattice mismatch between the silicon substrate and the overlying GaN epi-layers, and which can cause significant wafer bowing (microns) over large diameter substrates. For large area die, e.g. 2 mm×6 mm, or 10 mm×10 mm or more, where significant tensile stresses may be present across the die area itself, intra-die trenches may also be provided for stress relief, i.e. to divide the die area into a plurality of smaller area, facilitate subsequent fabrication steps and to further reduce risk that defects can potentially propagate and cause cracking and/or delamination of the epi-layers from the substrate.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A wafer scale nitride semiconductor device structure comprising:

a silicon substrate having formed thereon a GaN epi-layer stack for a plurality of GaN die, said plurality of GaN die being arranged as an array with dicing streets therebetween;

each *of at least one of the* GaN die comprising:

a part of the GaN epi-layer stack, the GaN epi-layer stack comprising a GaN/AlGaN hetero-layer structure defining a two dimensional electron gas (2DEG) active layer [for] *of* a lateral GaN transistor;

source, drain and gate electrodes of the lateral GaN transistor being provided on [a front-side] *an upper side* of the GaN epi-layer stack over an active area of the GaN die, an inactive area of the GaN epi-layer stack surrounding said active area of [each] *the* GaN die[, and]*;* an overlying interconnect structure *that overlies a portion of the GaN epi-layer stack, the overlying interconnect structure* comprising *metallization and one or more dielectric layers;*

*the* metallization [and dielectric layers, defining respective source, drain and gate connections and contact areas] *defining a source contact, a drain contact, and a gate contact of the lateral GaN transistor, the metallization electrically connecting and shorting the source contact with the source electrode, the drain contact with the drain electrode, and the gate contact with the gate electrode,*

*an upmost dielectric layer of the one or more dielectric layers having an upper surface that, together with an upper surface of the source and drain contacts, defines at least part of an upper surface of the overlying interconnect structure*; and a trench structure formed around a periphery of [each] *the* GaN die in said inactive area, the trench structure comprising a *trench and a trench cladding;*

*the* trench etched through layers of the overlying interconnect structure, through the GaN epi-layer stack, and into a surface region of the silicon substrate to a depth below an interface between the silicon substrate and the GaN epi-layer stack;

[the trench structure further comprising a trench cladding,] the trench cladding comprising a metal layer and an overlying passivation layer *that overlies the metal layer*, the trench cladding extending *conformally* over *at least an* inner [sidewalls] *sidewall* of the trench [and sealing exposed surfaces of layers of the overlying interconnect structure, layers of the GaN epi-layer stack, and] *to thereby seal at least layers of the GaN epi-layer stack at the inner sidewall and to thereby seal at least* the interface [of] *between the silicon substrate and* the GaN epi-layer stack [and the silicon substrate] *at the inner sidewall, the trench cladding also extending conformally from the inner sidewall of the trench and over at least a portion of the upper surface of the overlying interconnect structure and contacting the source contact*, wherein the metal layer of the trench cladding is conductive and connects the silicon substrate to [a] *the* source contact [area] of the lateral GaN transistor *such that the source contact is electrically connected and shorted to the silicon substrate through the metal layer*.

2. The device structure of claim 1, wherein the trench structure is laterally spaced from the dicing street.

3. The device structure of claim 1, wherein the trench structure [is laterally spaced from a scribe line of] *extends into* the dicing street.

4. The device structure of claim 1, wherein the trench structure extends across the dicing street between adjacent GaN die.

5. The device *structure* of claim 1, wherein the GaN die further comprises a seal ring formed over the inactive [region] *area* of the GaN epi-layer stack and surrounding the lateral GaN transistor, the trench structure being formed between the seal ring and the dicing street, and wherein the metal layer of the trench cladding connects the silicon substrate to a metallization layer of the seal ring.

6. A nitride semiconductor device comprising:

a GaN die comprising:

a silicon substrate and a GaN epi-layer stack formed thereon, *the GaN epi-layer stack* comprising a GaN/AlGaN hetero-layer structure defining a two dimensional electron gas (2DEG) active layer [for] *of* a lateral GaN transistor;

source, drain and gate electrodes of the lateral GaN transistor being provided on [a front-side] *an upper side* of the GaN epi-layer stack over an active area of the GaN die, an inactive area of the GaN epi-layer stack surrounding said active area of [each] *the GaN* die; [and]

an overlying interconnect structure *that overlies a portion of the GaN epi-layer stack, the overlying interconnect structure* comprising *metallization and one or more dielectric layers;*

*the* metallization [and dielectric layers, defining respective source, drain and gate connections and contact areas] *defining a source contact, a drain contact, and a gate contact of the lateral GaN transistor, the metallization electrically connecting and shorting the source contact with the source electrode, the drain contact with the drain electrode, and the gate contact with the gate electrode,*

*an upmost dielectric layer of the one or more dielectric layers having an upper surface that, together with an upper surface of the source and drain contacts, defines at least part of an upper surface of the overlying interconnect structure*;

a trench structure formed around a periphery of the GaN die, the trench structure comprising a *trench and a trench cladding;*

*the* trench etched through layers of the overlying interconnect structure, through layers of the GaN epi-layer stack, and into a surface region of the silicon substrate to a depth below the interface between the silicon substrate and the GaN epi-layer stack;

[the trench structure further comprising a trench cladding,] the trench cladding comprising a conductive metal layer and an overlying passivation layer *that overlies the metal layer*, the trench cladding extending *conformally* over *at least an* inner [sidewalls] *sidewall* of the trench [and sealing exposed surfaces of layers of the interconnect structure, layers of the GaN epi-layer stack, and] *to thereby seal at least layers of the GaN epi-layer stack at the inner sidewall and to thereby seal at least* the interface [of] *between the silicon substrate and* the GaN epi-layer stack [and the silicon substrate] *at the inner sidewall, the trench cladding also extending conformally from the inner sidewall of the trench and over at least a portion of the upper surface of the overlying interconnect structure and contacting the source contact*, wherein the conductive metal layer of the trench cladding connects the silicon substrate to [a] *the* source contact [area] of the lateral GaN transistor *such that the source contact is electrically connected and shorted to the silicon substrate through the conductive metal layer*.

7. The device of claim 6, wherein the trench structure is laterally spaced from edges of the GaN die.

8. The device of claim 6, wherein the trench structure extends to edges of the GaN die.

9. The device of claim 6, wherein the GaN die further comprises a seal ring formed over the inactive [region] *area* of the GaN epi-layer stack and surrounding the lateral GaN transistor, the trench structure being formed between the seal ring and edges of the GaN die, and wherein the conductive metal layer of the trench cladding connects the silicon substrate to a metallization layer of the seal ring.

10. The device [structure] of claim 6, wherein the lateral GaN transistor comprises a plurality of transistor islands of a multi-island transistor, and further comprising a plurality of trenches dividing the active [device] area of the transistor into a plurality of areas, each of said plurality of areas accommodating a plurality of transistor islands.

11. The device [structure] of claim 6, wherein the lateral GaN transistor comprises a plurality of transistor islands of a multi-island transistor, and further comprising a plurality of trenches dividing the active [device] area of the transistor into a plurality of areas, each of said plurality of areas accommodating an individual transistor island.

12. A method of fabrication of a *wafer scale* nitride semiconductor device structure[as defined in claim 6], comprising steps of:

providing [the] *a* silicon substrate having formed thereon a GaN epi-layer [structure] *stack* for a plurality of GaN die, the *plurality of* GaN die being arranged as an array with dicing streets therebetween;

each *of at least one of the* GaN die comprising:

*a part of* the GaN epi-layer stack, *the GaN epi-layer stack* comprising [the] *a* GaN/AlGaN hetero-layer structure defining the two dimensional electron gas (2DEG) active layer [for] *of* the lateral GaN transistor;

[the] source, drain and gate electrodes of the lateral GaN transistor being provided on [the front-side] *an upper side* of the GaN epi-layer stack over the active area of the GaN die, the inactive area of the GaN epi-layer stack surrounding said active area of [each] *the GaN* die; [and the] *an* overlying interconnect structure[,] *that overlies a portion of the GaN epilayer stack, the overlying interconnect structure* comprising *metallization and one or more dielectric layers;* the metallization [and dielectric layers, defining respective the source, drain and gate connections and contact areas] *defining a source contact, a drain contact, and a gate contact of the lateral GaN transistor, the metallization electrically connecting and shorting the source contact with the source electrode, the drain contact with the drain electrode, and the gate contact with the gate electrode,*

*an upmost dielectric layer of the one or more dielectric layers having an upper surface that, together with an upper surface of the source and drain contacts, defines at least part of an upper surface of the overlying interconnect structure*; and

*providing stress relief prior to dicing, comprising* etching [the] *a* trench structure around all sides of each GaN die, *the trench structure* extending through the *one or more* layers of the overlying interconnect structure, through the layers of the GaN epi-layer stack, and into the surface region of the silicon substrate to the depth below the interface of the GaN epi-layer stack and the silicon substrate, the trench structure being laterally spaced from a dicing street of each edge of the GaN die;

providing [the] *a* trench cladding comprising the conductive metal layer and the overlying passivation layer, the trench cladding extending *conformally* over *at least* the inner sidewalls of the trench structure and sealing *at least* the exposed surfaces of the overlying interconnect structure, the layers *of* the GaN epi-layer stack, and the interface of the GaN epi-layer stack and the silicon substrate; and wherein the conductive metal layer of the trench cladding connects the silicon substrate to the source contact [area] of the lateral GaN transistor *such that the source contact is electrically connected and shorted to the silicon substrate through the metal layer*.

13. The method of claim 12, wherein etching the trench structure comprises:

masking at least active areas of each GaN die and part of a surrounding inactive region *exposing areas to be trenched*;

*in said areas,* performing a sequence of dry etching steps comprising:

removing layers [within the trench extending over the GaN epi-layer stack] *of the overlying interconnect structure,* removing the [layers of the] GaN [epi-stack within the trench] *epi-layer stack*, and removing the surface region of the silicon substrate [within the trench] to the depth below the interface of the GaN epi-layer stack *epi-layers* and the silicon substrate.

14. The method of claim 12, further comprising dicing [the silicon substrate along scribe lines laterally spaced from each trench] *along the dicing streets to singulate the plurality of GaN die*.

15. The method of claim [12] *14*, wherein dicing comprises any one of sawing, laser ablation, plasma dicing, stealth dicing, laser induced splitting/cleaving, and a combination thereof.

16. The method of claim 12, wherein providing the *conductive metal layer of the* trench cladding comprises providing a metal barrier layer against electro-migration of contaminant ions.

*17. The device of claim 6, wherein the overlying passivation layer of the trench cladding comprises at least one of a layer of a dielectric oxide and a layer of a dielectric nitride.*

*18. A wafer scale nitride semiconductor device structure comprising: a silicon substrate having formed thereon a GaN epi-layer stack for a plurality of GaN die, said plurality of GaN die being arranged as an array with dicing streets therebetween;*

*each of at least one of the GaN die comprising:*

*an area of the GaN epi-layer stack, the GaN epi-layer stack comprising a GaN/AlGaN hetero-layer structure defining a two-dimensional electron gas (2DEG) active layer of a lateral GaN transistor;*

*source, drain and gate electrodes of the lateral GaN transistor being provided on an upper side of the GaN epi-layer stack over an active area of the GaN die, an inactive area of the GaN epi-layer stack surrounding said active area of the GaN die;*

*an overlying structure that overlies a portion of the GaN epi-layer stack, the overlying structure comprising metallization and one or more dielectric layers,*

*the metallization defining a source contact, a drain contact, and a gate contact of the lateral GaN transistor, the metallization electrically connecting and shorting the source contact with the source electrode, the drain contact with the drain electrode, and the gate contact with the gate electrode,*

*the one or more dielectric layers defining respective source, drain and gate connections and contact areas,*

*the metallization and the one or more dielectric layers defining a seal ring formed on the inactive area of the GaN die, the seal ring surrounding the active area of the GaN die; and*

*a trench formed around a periphery of the GaN die in said inactive area, the trench surrounding the seal ring and laterally spaced from the seal ring; the trench being etched through the one or more dielectric layers of the overlying structure, through the GaN epi-layer stack, and into a surface region of the silicon substrate to a depth below an interface between the silicon substrate and the GaN epi-layer stack; and*

*at least one layer of dielectric extending from the active area over the seal ring, and into the trench to form a dielectric trench cladding extending conformally over at least inner sidewalls of the trench and sealing at least surfaces of dielectric layers of the overlying structure, layers of the GaN epi-layer stack, and the interface of the GaN epi-layer stack and the silicon substrate.*

*19. The device structure of claim 18, wherein the at least one layer of dielectric of the dielectric trench cladding comprises at least one of a dielectric oxide and a dielectric nitride.*

*20. The device structure of claim 18, wherein the at least one layer of dielectric of the dielectric trench cladding comprises a layer of silicon dioxide and an overlying passivation layer of silicon nitride.*

*21. The device structure of claim 18, wherein the trench is laterally spaced from the dicing streets between adjacent GaN die.*

*22. The device structure of claim 18, wherein the trench extends across dicing streets between adjacent GaN die.*

*23. A nitride semiconductor device comprising:*

*a GaN die comprising:*

*a silicon substrate and a GaN epi-layer stack formed thereon, the GaN epi-layer stack comprising a GaN/AlGaN hetero-layer structure defining a two-dimensional electron gas (2DEG) active layer of a lateral GaN transistor;*

*source, drain and gate electrodes of the lateral GaN transistor being provided on an upper side of the GaN epi-layer stack over an active area of the GaN die, an inactive area of the GaN epi-layer stack surrounding said active area of the GaN die;*

*an overlying structure that overlies a portion of the GaN epi-layer stack, the overlying structure comprising metallization and one or more dielectric layers:*

*the metallization defining a source contact, a drain contact, and a gate contact of the lateral GaN transistor, the metallization electrically connecting and shorting the source contact with the source electrode, the drain contact with the drain electrode, and the gate contact with the gate electrode,*

*the one or more dielectric layers defining respective source, drain and gate connections and contact areas,*

*the metallization and the one or more dielectric layers defining a seal ring formed on the inactive area of the GaN die, the seal ring surrounding the active area of the GaN die;*

*a trench formed around a periphery of the GaN die, the trench surrounding the seal ring, the trench being etched through the one or more dielectric layers of the overlying structure, through layers of the GaN epi-layer stack, and into a surface region of the silicon substrate to a depth below an interface between the silicon substrate and the GaN epi-layer stack; and*

*at least one layer of dielectric extending from the active area, over the seal ring, and into the trench to form a dielectric trench cladding extending conformally over at least inner sidewalls of the trench and sealing at least surfaces of dielectric layers of the overlying structure, layers of the GaN epi-layer stack, and the interface of the GaN epi-layer stack and the silicon substrate.*

*24. The nitride semiconductor device of claim 23, wherein the at least one layer of dielectric of the dielectric trench cladding comprises at least one of a dielectric oxide and a dielectric nitride.*

*25. The nitride semiconductor device of claim 23, wherein the at least one layer of dielectric of the dielectric trench cladding comprises a layer of silicon dioxide and an overlying passivation layer of silicon nitride.*

*26. The nitride semiconductor device of claim 23, wherein the trench extends around the periphery of the GaN die, spaced from diced edges of the GaN die.*

*27. The nitride semiconductor device of claim 23, wherein the trench extends to diced edges of the GaN die.*

*28. A method of fabricating a wafer scale nitride semiconductor device, comprising steps of:*

*providing a silicon substrate having formed thereon a GaN epi-layer stack for a plurality of GaN die arranged as an array with dicing streets therebetween;*

*each of at least one of the GaN die comprising:*

*an area of the GaN epi-layer stack comprising a GaN/AlGaN hetero-layer structure defining a two-dimensional electron gas (2DEG) active layer of a lateral GaN transistor;*

*source, drain and gate electrodes of the lateral GaN transistor being provided on an upper side of the GaN epi-layer stack over an active area of the GaN die, an inactive area of the GaN epi-layer stack surrounding said active area of the die;*

*an overlying structure that overlies a portion of the GaN epi-layer stack, the overlying structure comprising metallization and one or more dielectric layers;*

*the metallization defining a source contact, a drain contact, and a gate contact of the lateral GaN transistor, the metallization electrically connecting and shorting the source contact with the source electrode, the drain contact with the drain electrode, and the gate contact with the gate electrode,*

*the one or more dielectric layers defining respective source, drain and gate connections and contact areas,*

*the metallization and the one or more dielectric layers defining a seal ring formed on the inactive area and surrounding the active area of the die, and the dielectric layers of the overlying structure extending over the inactive area;*

*providing stress relief prior to dicing, comprising etching a trench around a periphery of each GaN die, the trench extending through the one or more dielectric layers of the overlying structure, through layers of the*

*GaN epi-layer stack, and into the surface region of the silicon substrate to a depth below an interface of the GaN epi-layer stack and the silicon substrate, the trench surrounding the seal ring, between the seal ring and a dicing street of each edge of the GaN die; and*

*providing at least one layer of dielectric extending from the active area, over the seal ring, and into the trench to form a dielectric trench cladding extending conformally over at least inner sidewalls of the trench and sealing at least surfaces of the overlying structure, the layers of the GaN epi-layer stack, and the interface of the GaN epi-layer stack and the silicon substrate.*

*29. The method of claim 28, wherein said trench around the periphery of each GaN die is laterally spaced from the dicing streets or extends across the dicing streets, and comprising dicing along said dicing streets to singulate the plurality of GaN die, wherein dicing comprises any one of sawing, laser ablation, plasma dicing, stealth dicing, laser induced splitting/cleaving, and a combination thereof.*

*30. The method of claim 28, wherein etching the trench structure comprises:*

*masking at least active areas of each GaN die and part of a surrounding inactive area exposing areas to be trenched;*

*in said areas, performing a sequence of dry etching steps comprising:*

*removing layers of the overlying structure,*

*removing the GaN epi-layer stack, and*

*removing the surface region of the silicon substrate to the depth below the interface of the GaN epi-layer stack and the silicon substrate,*

*providing at least one layer of dielectric extending from the active area, over the seal ring, and into the trench to form a dielectric trench cladding extending conformally over inner sidewalls of the trench and sealing surfaces of the overlying structure, the layers of the GaN epi-layer stack, and the interface of the GaN epi-layer stack and the silicon substrate.*

* * * * *